US009231030B2

(12) United States Patent
Choi et al.

(10) Patent No.: US 9,231,030 B2
(45) Date of Patent: Jan. 5, 2016

(54) ORGANIC LIGHT-EMITTING DISPLAY DEVICE AND METHOD OF MANUFACTURING THE SAME

(71) Applicants: Jun-Ho Choi, Yongin (KR); Jin-Koo Chung, Yongin (KR); Seong-Min Kim, Yongin (KR)

(72) Inventors: Jun-Ho Choi, Yongin (KR); Jin-Koo Chung, Yongin (KR); Seong-Min Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 16 days.

(21) Appl. No.: 13/949,452

(22) Filed: Jul. 24, 2013

(65) Prior Publication Data

US 2014/0145156 A1    May 29, 2014

(30) Foreign Application Priority Data

Nov. 29, 2012    (KR) .................. 10-2012-0137338

(51) Int. Cl.
  *H01L 27/32*    (2006.01)
  *H01L 51/56*    (2006.01)
  *H01L 51/52*    (2006.01)

(52) U.S. Cl.
  CPC ............ *H01L 27/32* (2013.01); *H01L 51/5275* (2013.01); *H01L 51/56* (2013.01); *H01L 27/3246* (2013.01)

(58) Field of Classification Search
  USPC .................. 257/40, 88–89, 98–99, E33.062, 257/E33.064; 438/29, 34
  See application file for complete search history.

(56) References Cited

U.S. PATENT DOCUMENTS

| | | | |
|---|---|---|---|
| 2008/0296600 A1* | 12/2008 | Kwack et al. | 257/98 |
| 2011/0121271 A1 | 5/2011 | Jeon et al. | |
| 2011/0204388 A1 | 8/2011 | Jeong et al. | |
| 2012/0097990 A1* | 4/2012 | Koh et al. | 257/88 |
| 2012/0104422 A1* | 5/2012 | Lee et al. | 257/88 |
| 2012/0313099 A1 | 12/2012 | Chung et al. | |

FOREIGN PATENT DOCUMENTS

| | | |
|---|---|---|
| KR | 10-2011-0058126 A | 6/2011 |
| KR | 10-2011-0096451 A | 8/2011 |
| KR | 10-2012-0134464 A | 12/2012 |

* cited by examiner

*Primary Examiner* — Khaja Ahmad
(74) *Attorney, Agent, or Firm* — Lee & Morse, P.C.

(57) ABSTRACT

An organic light-emitting display device includes a thin film transistor, a first insulating layer, a first electrode a second insulating layer, an organic emission layer, a second electrode, a first auxiliary layer in a first region on the second electrode and having a first edge, a third electrode in a second region, on the second electrode and having a second edge contacting the first edge of the first auxiliary layer, and a second auxiliary layer on at least the first region and having a refractive index higher than the first auxiliary layer.

37 Claims, 17 Drawing Sheets

ORGANIC LIGHT-EMITTING DISPLAY DEVICE AND METHOD OF MANUFACTURING THE SAME

CROSS-REFERENCE TO RELATED PATENT APPLICATION

This application claims the benefit of Korean Patent Application No. 10-2012-0137338, filed on Nov. 29, 2012, in the Korean Intellectual Property Office, the disclosure of which is incorporated herein in its entirety by reference.

BACKGROUND

1. Field

Embodiments relate to an organic light-emitting display device and a method of manufacturing the same.

2. Description of the Related Art

Organic light-emitting display devices, which are self-emitting display devices that electrically excite an organic compound, have attracted much attention as next-generation display devices because the organic light-emitting display devices may be driven at a low voltage, may be easily made thin, and may have advantages such as wide viewing angles, fast response speeds, or the like which were previously pointed out as problems in liquid crystal display (LCD) devices.

SUMMARY

Embodiments are directed to an organic light-emitting display device, including a substrate, a thin film transistor formed on the substrate, a first insulating layer that covers the thin film transistor, a first electrode that is formed on the first insulating layer and is electrically connected to the thin film transistor, a second insulating layer that is formed on the first insulating layer to cover the first electrode and has an opening exposing a part of the first electrode, an organic emission layer that is formed on a part of the second insulating layer and on the first electrode, a second electrode that is formed on the second insulating layer and the organic emission layer, a first auxiliary layer that is formed in a first region on the second electrode and has a first edge, a third electrode that is formed in a second region, which is a region other than the first region, on the second electrode and has a second edge of which a lateral surface contacts a lateral surface of the first edge of the first auxiliary layer, and a second auxiliary layer that is formed on at least the first region and has a refractive index higher than that of the first auxiliary layer.

The second auxiliary layer may be disposed in the first region on the second electrode, wherein the first auxiliary layer covers the second auxiliary layer.

The second auxiliary layer may be disposed in the first region on the first auxiliary layer.

The second auxiliary layer may be disposed up to the second region on the third electrode.

The second auxiliary layer may include at least one material having a high refractive index among N4,N4'-diphenyl-N4,N4'-bis(9-phenyl-9H-carbazol-3-yl)diphenyl-4,4'-diamine and N(diphenyl-4-yl)9,9-dimethyl-N-(4(9-phenyl-9H-carbazol-3-yl)phenyl)-9H-fluorene-2-amine.

The first auxiliary layer may include at least one material among 8-quinolinolato lithium and 2-(4-(9,10-di(naphthalene-2-yl)anthracene-2-yl)phenyl)-1-phenyl-1H-benzo-[D]imidazole.

Both the first auxiliary layer and the second auxiliary layer may be disposed in the first region on the second electrode, and the material of the first auxiliary layer and the material having a high refractive index may be mixed with each other to form one layer.

The second auxiliary layer may be formed such that light transmission is possible.

The second auxiliary layer may have a thickness greater than that of the first auxiliary layer.

The second auxiliary layer may have a refractive index of about 1.8 to about 2.0 with respect to a wavelength of green light.

The second auxiliary layer may have a refractive index of about 1.9 to about 2.5 with respect to a wavelength of blue light.

The second electrode may be formed such that light transmission is possible.

The second electrode may include silver.

The second electrode may include indium tin oxide, indium zinc oxide, zinc oxide, or $In_2O_3$.

The third electrode may have a thickness greater than that of the second electrode.

The device may further include a transmission area and a pixel area that is adjacent to the transmission area and in which light emission occurs. The transmission area and the pixel area may be located in the first region, the first electrode may overlap with the pixel area, and the first electrode may be located to cover the thin film transistor.

The first auxiliary layer may be formed such that light transmission is possible.

Adhesion between the third electrode and the first auxiliary layer may be lower than adhesion between the third electrode and the second electrode.

The third electrode may include magnesium.

Embodiments are also directed to an organic light-emitting display device, including a plurality of pixels, each pixel including a thin film transistor, a first electrode electrically connected to the thin film transistor, a second electrode that covers the pixel, and an organic emission layer that is interposed between the first electrode and the second electrode, a plurality of first auxiliary layers that are located to correspond to at least one of the pixels, a third electrode that is located between the pixels, is adjacent to each of the first auxiliary layers, and is electrically connected to the second electrode, and a second auxiliary layer that is stacked on at least the first auxiliary layer and has a refractive index higher than that of the first auxiliary layer.

The second auxiliary layer may be disposed between the second electrode and the first auxiliary layer.

The second auxiliary layer may be disposed on the first auxiliary layer to cover the first auxiliary layer.

The second auxiliary layer may be disposed on the auxiliary layer to cover up to the third electrode.

The second auxiliary layer may include at least one material having a high refractive index among N4,N4'-diphenyl-N4,N4'-bis(9-phenyl-9H-carbazol-3-yl)diphenyl-4,4'-diamine and N(diphenyl-4-yl)9,9-dimethyl-N-(4(9-phenyl-9H-carbazol-3-yl)phenyl)-9H-fluorene-2-amine.

The first auxiliary layer may include at least one material among 8-quinolinolato lithium and 2-(4-(9,10-di(naphthalene-2-yl)anthracene-2-yl)phenyl)-1-phenyl-1H-benzo-[D]imidazole.

Both the first auxiliary layer and the second auxiliary layer may be disposed on the second electrode, and the material of the first auxiliary layer and the material having a high refractive index may be mixed with each other to form one layer.

The second auxiliary layer may be formed such that light transmission is possible.

The second auxiliary layer may have a thickness greater than that of the first auxiliary layer.

The second auxiliary layer may have a refractive index of about 1.8 to about 2.0 with respect to a wavelength of green light.

The second auxiliary layer may have a refractive index of about 1.9 to about 2.5 with respect to a wavelength of blue light.

Adhesion between the third electrode and the first auxiliary layer may be lower than adhesion between the third electrode and the second electrode.

Embodiments are also directed to a method of manufacturing an organic light-emitting display device, the method including forming a plurality of thin film transistors that are respectively located in a plurality of pixels on a substrate, forming a plurality of organic light-emitting diodes that are electrically connected to each of the thin film transistors, are respectively located in the plurality of pixels, and includes a first electrode, an organic emission layer, and a second electrode, forming a plurality of first auxiliary layers that are located to correspond to at least one of the pixels, forming a third electrode, which is adjacent to each of the first auxiliary layers and is electrically connected to second electrode, by depositing a metal on the pixels, and forming a second auxiliary layer that is stacked on the first auxiliary layer and has a refractive index higher than that of the first auxiliary layer.

In the forming of the second auxiliary layer, a material having a high refractive index may be deposited on the second electrode using a mask that has an opening having a pattern corresponding to at least one of the pixels.

In the forming of the second auxiliary layer, the material having a high refractive index may be deposited on the entire substrate to cover the first auxiliary layer and the third electrode.

In the forming of the first auxiliary layer and the second auxiliary layer, the material having a high refractive index and the material of the first auxiliary layer may be formed on the second electrode by co-evaporation using a mask that has an opening having a pattern corresponding to at least one of the pixels.

The forming of the first auxiliary layer may be performed using a mask that has an opening having a pattern corresponding to the first auxiliary layer.

The forming of the first auxiliary layer may be performed by laser transfer using a donor film corresponding to the first auxiliary layer.

The forming of the third electrode may include depositing the metal on the first auxiliary layer and in a region adjacent to the first auxiliary layer.

BRIEF DESCRIPTION OF THE DRAWINGS

The above and other features and advantages will become more apparent by describing in detail example embodiments with reference to the attached drawings in which.

DETAILED DESCRIPTION

Now, example embodiments will be described in detail with reference to the accompanying drawings. As used herein, the term "and/or" includes any and all combinations of one or more of the associated listed items. Expressions such as "at least one of," when preceding a list of elements, modify the entire list of elements and do not modify the individual elements of the list.

Figure 1:
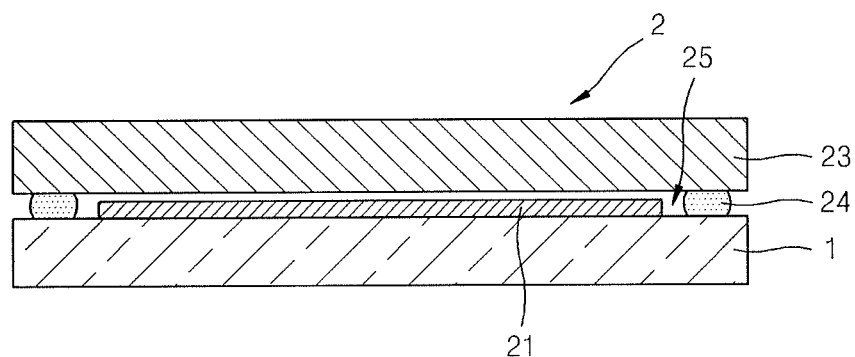
FIG. 1 is a cross-sectional view illustrating an organic light-emitting display device according to an embodiment.

FIG. 1 is a cross-sectional view illustrating an organic light-emitting display device according to an embodiment.

Referring to FIG. 1, the organic light-emitting display device according to an embodiment includes an organic emission unit 21 formed on a substrate 1 and an encapsulation substrate 23 that seals the organic emission unit 21.

The encapsulation substrate 23 is formed of a transparent member to display an image from the organic emission unit 21 and prevent external air and moisture from entering the organic emission unit 21.

Edges of the substrate 1 and the encapsulation substrate 23 are coupled to each other by a sealing material 24 to seal a space 25 between the substrate 1 and the encapsulation substrate 23. Moisture absorbent, filler, or the like may be located in the space 25.

Figure 2:
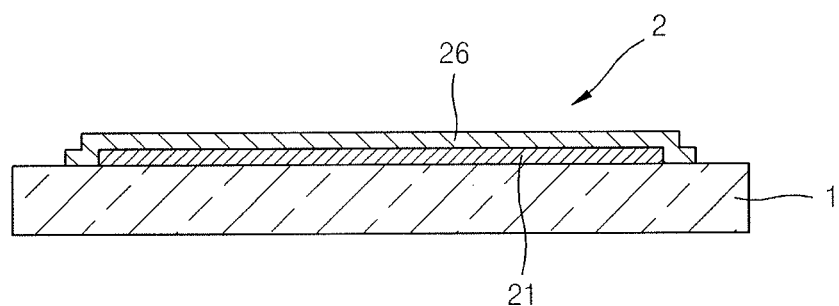
FIG. 2 is a cross-sectional view illustrating an organic light-emitting display device according to another embodiment.

As illustrated in FIG. 2, a sealing film 26 as a thin film may be formed on the organic emission unit 21 instead of the encapsulation substrate 23 so as to protect the organic emission unit 21 against external air. For example, the sealing film 26 may have a structure in which a layer formed of an inorganic material, such as silicon oxide or silicon nitride, and an organic material, such as epoxy or polyimide, are alternately formed. Alternatively, the sealing film 26 may have a structure including low melting glass such as tin oxide (SnO). Meanwhile, this is just an example and embodiments are not limited thereto and thus, any sealing structure on a transparent thin film may be used.

Figure 3:
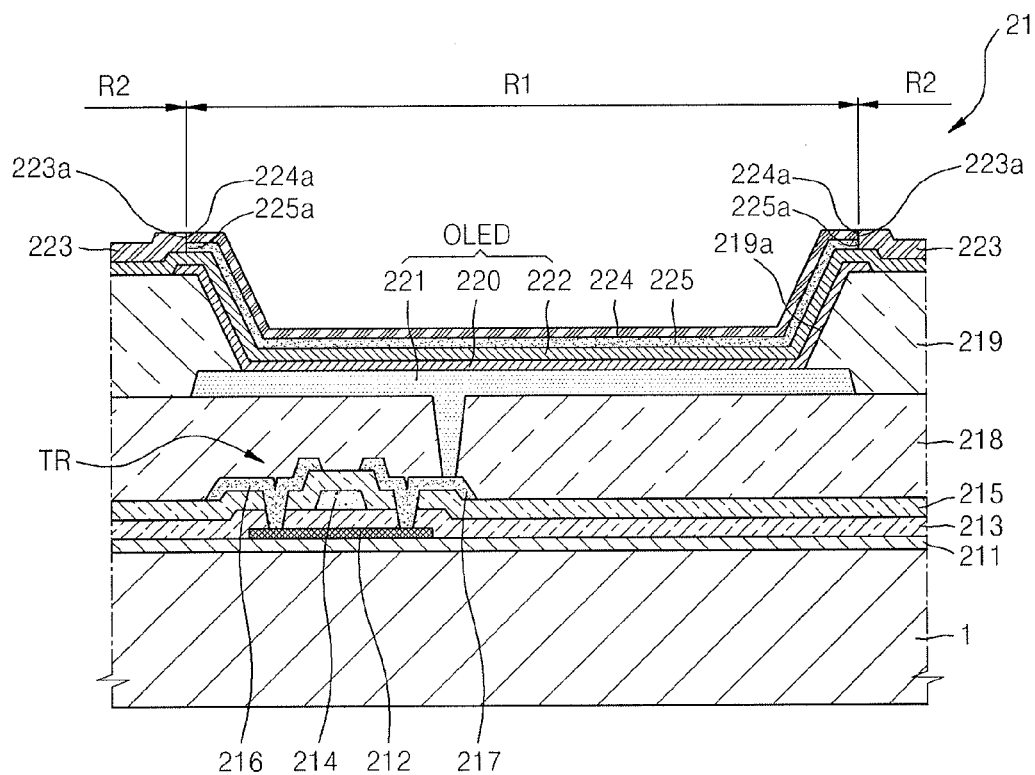
FIG. 3 is a cross-sectional view illustrating the organic emission unit of FIG. 1 or FIG. 2.

FIG. 3 is a cross-sectional view illustrating the organic emission unit 21 of FIG. 1 or FIG. 2. FIG. 3 illustrates one pixel of the organic emission unit 21 which includes a plurality of pixels.

According to an embodiment illustrated in FIG. 3, a buffer layer 211 is formed on a first surface 11 of the substrate 1, and a thin film transistor TR is formed on the buffer layer 211.

Although only one thin film transistor TR is illustrated in FIG. 3, the pixel may further include at least another thin film transistor and a capacitor to constitute a pixel circuit.

A semiconductor active layer 212 is formed on the buffer layer 211.

The buffer layer 211 may prevent penetration of impurities and planarize a surface, and may be formed of any of various other materials capable of performing such functions. For example, the buffer layer 211 may be formed of an inorganic material such as silicon oxide, silicon nitride, silicon oxynitride, aluminum oxide, aluminum nitride, titanium oxide, or titanium nitride, an organic material such as polyimide, polyester, or acryl, or a laminated body thereof. The buffer layer 211 is not an essential component, and may not be formed if necessary.

The semiconductor active layer 212 may be formed of polycrystalline silicon. However, embodiments are not limited thereto, and the semiconductor active layer 212 may be formed of an oxide semiconductor. For example, the semiconductor active layer 212 may be a G-I—Z—O layer [$(In_2O_3)a(Ga_2O_3)b(ZnO)c$ layer], wherein a, b, and c may be real numbers that satisfy conditions $a \geq 0$, $b \geq 0$, and $c > 0$, respectively.

A gate insulation layer 213 is formed on the buffer layer 211 to cover the semiconductor active layer 212, and a gate electrode 214 is formed on the gate insulation layer 213.

An insulating interlayer 215 is formed on the gate insulation layer 213 to cover the gate electrode 214, and a source electrode 216 and a drain electrode 217 are formed on the insulating interlayer 215 to contact the semiconductor active layer 212 via a contact hole.

The above-described structure of the thin film transistor TR is not limited thereto, and the thin film transistor TR may have any of various other structures. For example, the thin film transistor TR may be formed to have a top gate structure or a bottom gate structure in which the gate electrode 214 is disposed below the semiconductor active layer 212, and may have any of various other available structures.

A pixel circuit (not illustrated) including a capacitor together with the thin film transistor TR may be formed.

A first insulating layer 218 is formed to cover the pixel circuit including the thin film transistor TR. The first insulating layer 218 may have a single-layered structure or a multi-layered structure in which a top surface is flat. The first insulating layer 218 may be formed of an inorganic material and/or an organic material.

As illustrated in FIG. 3, the first electrode 221, which is electrically connected to the pixel circuit including the thin film transistor TR, is formed on the first insulating layer 218. The first electrode 221 is formed in an independent island shape in each pixel.

A second insulating layer 219 is formed on the first insulating layer 218 to cover an edge of the first electrode 221. An opening 219a is formed in the second insulating layer 219 so as to expose a central portion other than the edge of the first electrode 221.

An organic layer 220 is formed on the first electrode 221 exposed through the opening 219a, and a second electrode 222 is formed to cover the organic layer 220, thereby completing an organic light-emitting diode (OLED).

The organic layer 220 may be a low molecular weight organic layer or a high molecular weight organic layer. When the organic layer 220 is a low molecular weight organic layer, a hole injection layer (HIL), a hole transport layer (HTL), an emissive layer (EML), an electron transport layer (ETL), an electron injection layer (EIL), and the like, may be stacked in a single or multi structure to form the organic layer 220. The low molecular organic layer may be formed by vacuum deposition. At this time, the EML is independently formed in each of red, green, and blue pixels, and the HIL, the HTL, the ETL, and the EIL, which are common layers, may be commonly applied to the red, green, and blue pixels.

The HIL may be formed of, for example, a phthalocyanine compound including copper phthalocyanine or 4,4',4''-tri(N-carbazolyl)triphenylamine (TCTA), 4,4',4''-tris(3-methylphenylamino)triphenylamine (m-MTDATA), 1,3,5-tris[4-(3-methylphenylphenylamino)phenyl]benzene (m-MTDAPB) or the like, which are a starburst-type amine.

The HTL may be formed of, for example, N,N'-bis(3-methylphenyl)-N,N'-diphenyl-[1,1-biphenyl]-4,4'-diamine (TPD), N,N'-di(naphthalene-1-yl)-N,N'-diphenyl benzidine (α-NPD), or the like.

The EIL may be formed of, for example, lithium fluoride (LiF), sodium chloride (NaCl), cesium fluoride (CsF), lithium oxide ($Li_2O$), barium oxide (BaO), or 8-hydroxyquinolato lithium (Liq).

The ETL may be formed of, e.g., aluminum tris(8-hydroxyquinoline) (Alq3).

The EML may include a host material and a dopant material. Examples of the host material may include, for example, (8-hydroxy-quinolinato)aluminum (Alq3), 9,10-di(naphth-2-yl)anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene(BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4''-tris(carbazol-9-yl)triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), 9,9-bis(9-phenyl-9H-carbazol)fluorene (FL-2CBP), or the like.

Examples of the dopant material may include, e.g., 4,4'-bis[4-(di-p-tolylamino)styryl]biphenyl (DPAVBi), 9,10-di(naph-2-tyl)anthracene (ADN), 3-tert-butyl-9,10-di(naph-2-tyeanthracene (TBADN), or the like.

The first electrode 221 may serve as an anode and the second electrode 222 may serve as a cathode, or polarities of the first electrode 221 and the second electrode 222 may be reversed.

When the first electrode 221 serves as an anode, the first electrode 221 may be formed of a material such as indium tin oxide (ITO), indium zinc oxide (IZO), zinc oxide (ZnO), or $In_2O_3$ having a high work function. In case where the organic light-emitting display device of FIG. 3 is a top emission type organic light-emitting display device in which an image is displayed away from the substrate 1, the first electrode 221 may further include a reflective layer formed of for example, silver (Ag), magnesium (Mg), aluminum (Al), platinum (Pt), palladium (Pd), gold (Au), nickel (Ni), neodymium (Nd), iridium (Ir), chromium (Cr), lithium (Li), ytterbium (Yb), or calcium (Ca).

When the second electrode 222 serves as a cathode, the second electrode 222 may be formed of a metal, for example, Ag, Mg, Al, Pt, Pd, Au, Ni, Nd, Ir, Cr, Li, or Ca. In a case where the organic light-emitting display device of FIG. 3 is a top emission type organic light-emitting display device, the second electrode 222 may be formed of a light-transmitting material such as ITO, IZO, ZnO, or $In_2O_3$. In an implementation, the second electrode 222 may be formed as a thin film using Al, Ag, and/or Mg. For example, Mg:Ag and/or Ag may be formed into a single-layered structure or a multi-layered structure. Unlike the first electrode 221, the second electrode 222 is formed such that a common voltage is applied to all pixels, and for this, a common electrode, which is not patterned, is formed in each pixel. Alternatively, the second electrode 222 as a common electrode may be patterned in a mesh pattern in which a region other than a region corresponding to an emission region is removed.

In case where the organic light-emitting display device of FIG. 3 is a top emission type organic light-emitting display device, the second electrode 222 may include a transparent metal oxide or a thin metal layer. When the second electrode 222 is formed as a common electrode, surface resistance of the second electrode 222 may be increased, which may result in voltage drop. Thus, according to the present example embodiment, a third electrode 223 as an auxiliary electrode may be further formed to be electrically connected to the second electrode 222.

In addition, a top surface of the second electrode 222 may be damaged due to the encapsulation substrate 23 illustrated in FIG. 1. Furthermore, even in a case where the sealing film 26 is formed as illustrated in FIG. 2, the second electrode 222 may be easily damaged when forming the sealing film 26. Thus, according to the present example embodiment, a first auxiliary layer 224 as a capping layer may be formed on the second electrode 222.

A material for forming the first auxiliary layer 224 in order to facilitate patterning of the third electrode 223 may have relatively poor adhesion to a material for forming the third electrode 223. The material for forming the first auxiliary layer 224 may have a low refractive index. In a case where the organic light-emitting display device is a top emission type organic light-emitting display device, when the first auxiliary layer 224 formed at a side emitting light has a low refractive index, an extraction ability of light emitted from an organic emission layer may be decreased, and thus optical properties of the organic light-emitting display device may be degraded. Thus, in the present example embodiment, a second auxiliary layer 225 as a high-reflective layer may be additionally formed in at least a region where light emission occurs so as to be stacked with first auxiliary layer 224.

In the example embodiment shown in FIG. 3, first, the second auxiliary layer 225 is formed in a first region R1 on the second electrode 222 and has a second edge 225a.

The first auxiliary layer 224 is formed in the first region R1 on the second auxiliary layer 225 to cover the second auxiliary layer 225 and has a first edge 224a.

The third electrode 223 is formed on a second region R2 on the second electrode 222 and has a third edge 223a. The third electrode 223 and the first auxiliary layer 224 are disposed in parallel to be adjacent to each other.

The first region R1 has an area that is wider than an area where light emission occurs in at least one pixel, and corresponds to a region covering the area where light emission occurs in the at least one pixel. The first auxiliary layer 224 and the second auxiliary layer 225 are formed in the entire first region R1, and an edge of the first region R1 is the first edge 224a of the first auxiliary layer 224. Here, the first edge 224a may be the same as the second edge 225a of the second auxiliary layer 225. The second region R2 corresponds to a region other than the first region R1 in the second electrode 222. The third electrode 223 is formed in the entire second region R2, and an edge of the second region R2 is the third edge 223a of the third electrode 223. The second region R2 is a region other than a region where light emission occurs.

A lateral surface of the first edge 224a of the first auxiliary layer 224 and a lateral surface of the third edge 223a of the third electrode 223 contact each other. In addition, a lateral surface of the second edge 225a of the second auxiliary layer 225 and the lateral surface of the third edge 223a of the third electrode 223 may contact each other.

The third electrode 223 may be formed to be thicker than the second electrode 222 so as to reduce surface resistance of the second electrode 222.

Meanwhile, the second auxiliary layer 225 may be formed to be thicker than the first auxiliary layer 224 so as to improve optical properties of the organic light-emitting display device.

In addition, since the second auxiliary layer 225 and the first auxiliary layer 224 cover a region where light emission occurs in the pixel, the second auxiliary layer 225 and the first auxiliary layer 224 may be formed such that light transmission is possible. The first auxiliary layer 224 may be formed as a thin film that is thinner than the third electrode 223, and the second auxiliary layer 225 may be formed to be thicker than the first auxiliary layer 224 and thinner than the third electrode 223, but embodiments are not limited thereto.

Meanwhile, in an embodiment, materials of the third electrode 223 and the first auxiliary layer 224 may be selected so that adhesion between the third electrode 223 and the first auxiliary layer 224 is lower than adhesion between the third electrode 223 and the second electrode 222.

For this, the first auxiliary layer 224 may include 8-quinolinolato lithium (Liq). However, embodiments are not limited thereto, and the first auxiliary layer 224 may be formed of a material including 2-(4-(9,10-di(naphthalene-2-yl)anthracene-2-yl)phenyl)-1-phenyl-1H-benzo-[D]imidazole (LG201).

The third electrode 223 may be formed of Mg.

The third electrode 223 and the second electrode 222 may be formed of the same metal, e.g., Mg. Thus, adhesion between the third electrode 223 and the second electrode 222 may be high. However, Mg may have poor adhesion to the material of the first auxiliary layer 224 described above. Thus, the third electrode 223 may be easily patterned by using adhesive properties between the third electrode 223 and the first auxiliary layer 224.

As described above, the third electrode 223 may be patterned to be formed only in the second region R2. After forming the organic layer 220 of the OLED, the third electrode 223 may not be patterned using photolithography, which is a wet process widely used as a general patterning method of a metal film. For example, if moisture and/or oxygen penetrates the organic layer 220 during the wet process, the lifespan of the OLED may be shortened. Therefore, the patterning of the third electrode 223 may be difficult using photolithography. According to the present example embodiment, the third electrode 223 may be patterned using adhesion between the third electrode 223 and the first auxiliary layer 224.

A material for forming the first auxiliary layer 224 which is selected to easily pattern the third electrode 223 may decrease optical properties of the organic emission layer. Accordingly, the second auxiliary layer 225 may be formed using a material having a high refractive index.

Here, the second auxiliary layer 225 may be formed of a material having a refractive index of about 1.8 to about 2.0 with respect to a wavelength of green light and a refractive index of about 1.9 to about 2.5 with respect to a wavelength of blue light. Here, the wavelength of green light may be about 500 nm to about 570 nm, e.g., about 550 nm, and the wavelength of blue light may be about 400 nm to about 500 nm, e.g., about 450 nm.

For example, examples of a material satisfying such a refractive index value may include N4,N4'-diphenyl-N4,N4'-bis(9-phenyl-9H-carbazol-3-yl)diphenyl-4,4'-diamine or N(diphenyl-4-yl)9,9-dimethyl-N-(4(9-phenyl-9H-carbazol-3-yl)phenyl)-9H-fluorene-2-amine, but embodiments are not limited thereto. When a material included in the second auxiliary layer 225 has a refractive index less than 1.8 with respect to the wavelength of green light or a refractive index less than 1.9 with respect to the wavelength of blue light, the refractive index may not be sufficiently high to improve optical properties, and thus the second auxiliary layer 225 may not be best suited for use together with the first auxiliary layer 224. Meanwhile, regarding the material included in the second auxiliary layer 225, it may difficult to find an organic material having a refractive index greater than 2.0 with respect to the wavelength of green light or a refractive index greater than 2.5 with respect to the wavelength of blue light.

Hereinafter, a method of manufacturing the organic emission unit 21 illustrated in FIG. 3 will be described in more detail.

Figure 4:
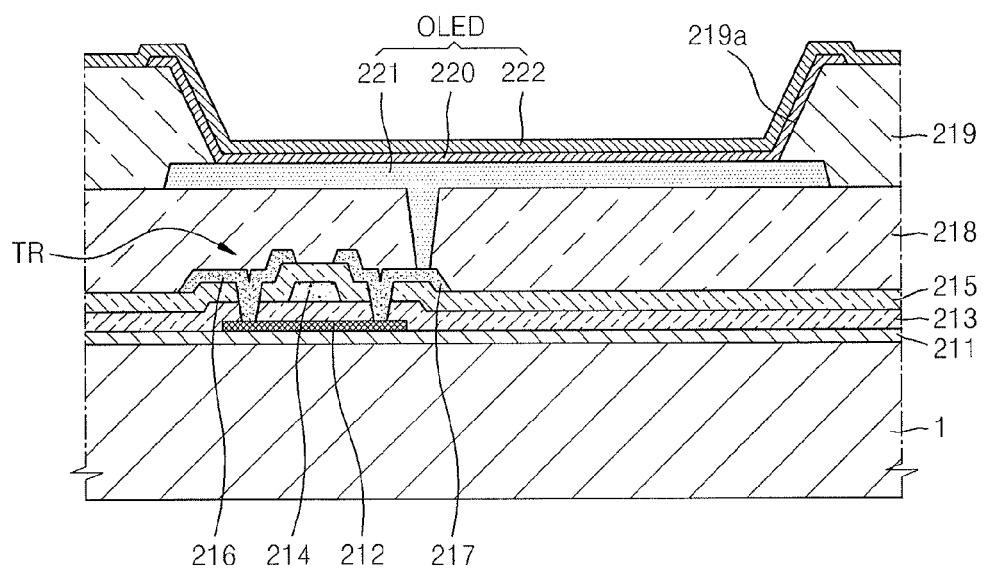
FIGS. 4 through 7 are cross-sectional views sequentially illustrating a method of manufacturing the organic emission unit illustrated in FIG. 3.
Figure 5:
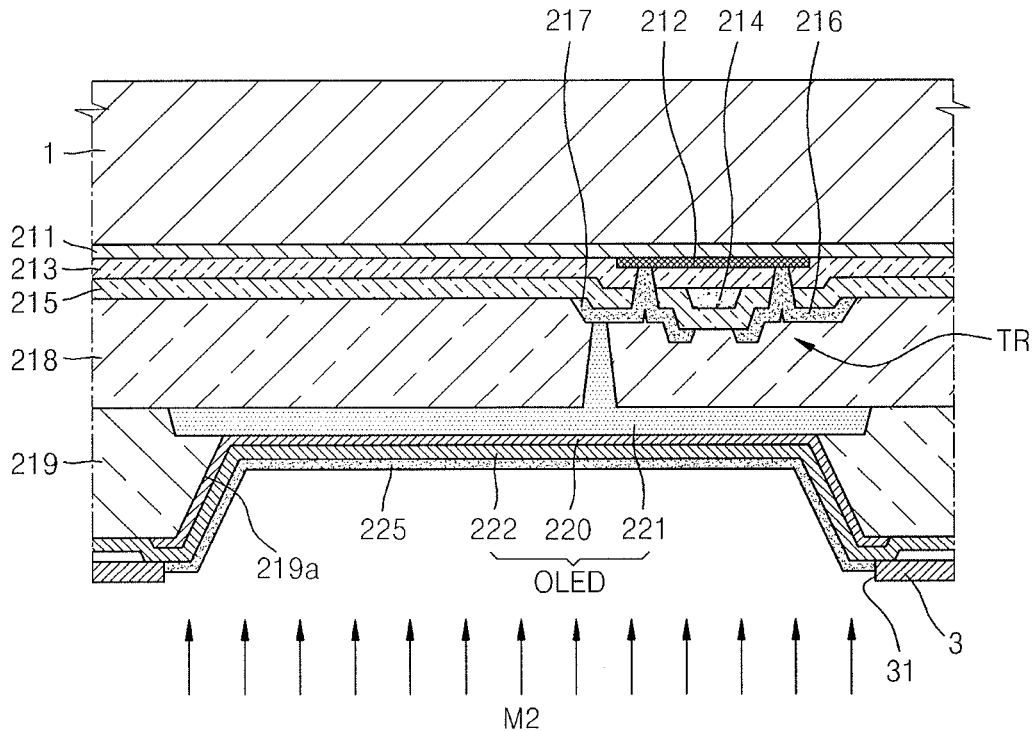

First, as illustrated in FIG. 4, after forming up to the second electrode 222, the second auxiliary layer 225 is formed using a mask 3 as illustrated in FIG. 5. Since the second auxiliary layer 225 may be formed of the aforementioned organic material, the second auxiliary layer 225 may be formed by thermal evaporation using the mask 3. An opening 31 is formed in the mask 3 to correspond to a pattern of the second auxiliary layer 225, and a material M2 for forming the second auxiliary layer 225 is deposited through the opening 31, thereby forming the second auxiliary layer 225.

Figure 6:
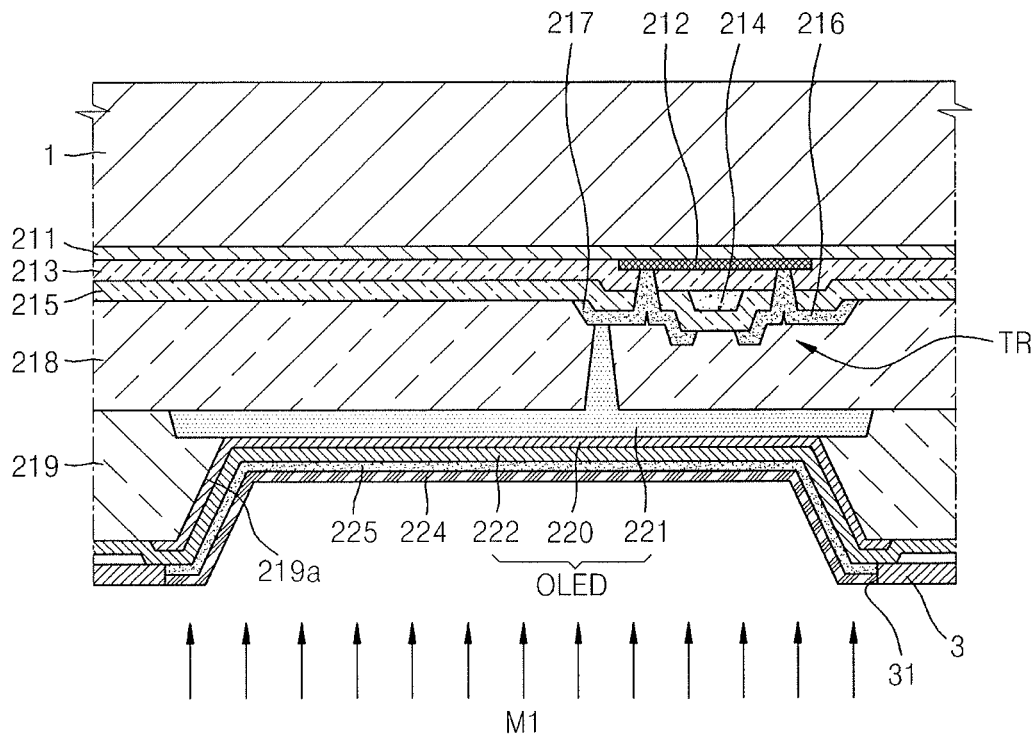

Next, as illustrated in FIG. 6, the first auxiliary layer 224 is formed using the mask 3 in the same way as the embodiment illustrated in FIG. 5. Since the first auxiliary layer 224 may be formed of the aforementioned organic material, the first auxiliary layer 224 may be formed by thermal evaporation using the mask 3. Meanwhile, embodiments are not limited thereto, and the first auxiliary layer 224 may be formed by laser transfer using a donor film in addition to the thermal evaporation. The opening 31 is formed in the mask 3 to correspond to a pattern of the first auxiliary layer 224, and a material M1 for forming the first auxiliary layer 224 is deposited through the opening 31, thereby forming the first auxiliary layer 224. Referring to FIGS. 5 and 6, the first auxiliary layer 224 and the second auxiliary layer 225 may have the same pattern.

Figure 7:
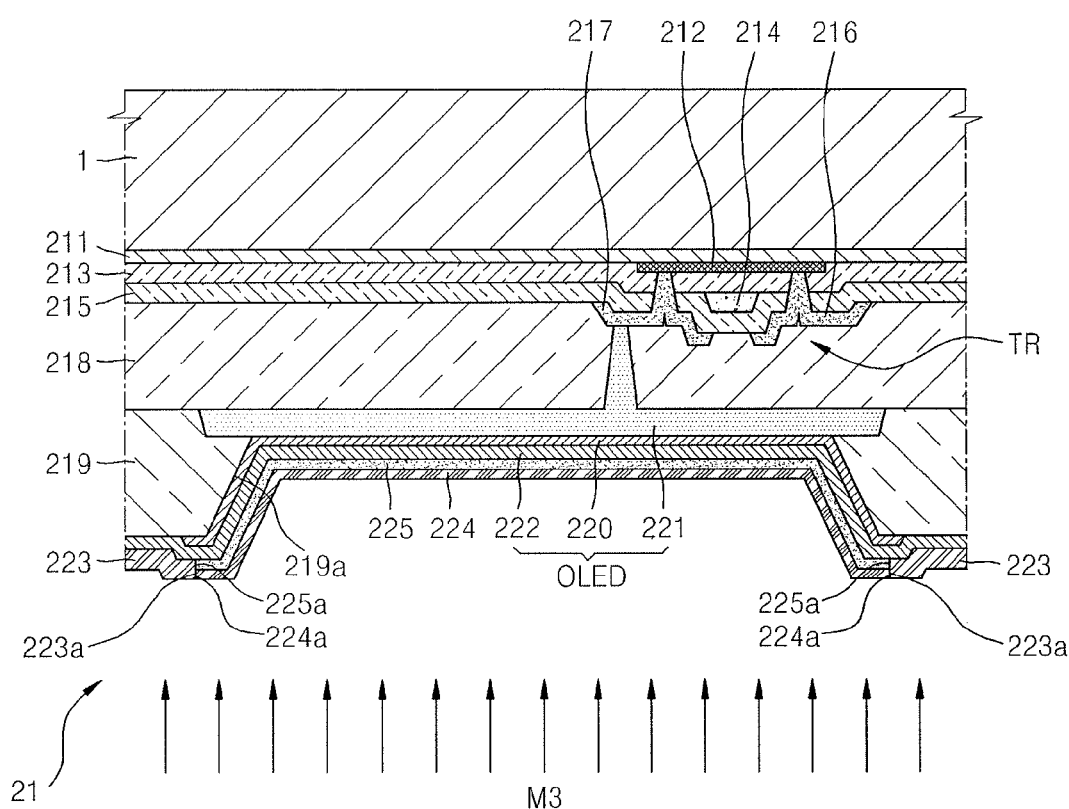

Next, as illustrated in FIG. 7, a material M3 for forming the third electrode 223 is entirely deposited on the organic emission unit 21. Although not illustrated in FIG. 7, the material M3 may be formed using an open mask that is opened with respect to all pixels or without using a mask.

In this case, since the material M3 for forming the third electrode 223 may have relatively poor adhesion to the first auxiliary layer 224, the material M3 may not be formed on the first auxiliary layer 224 and may be formed only on the second electrode 222 having relatively good adhesion. Accordingly, the third electrode 223 may be naturally patterned without using a separate mask or a patterning process.

Figure 8:
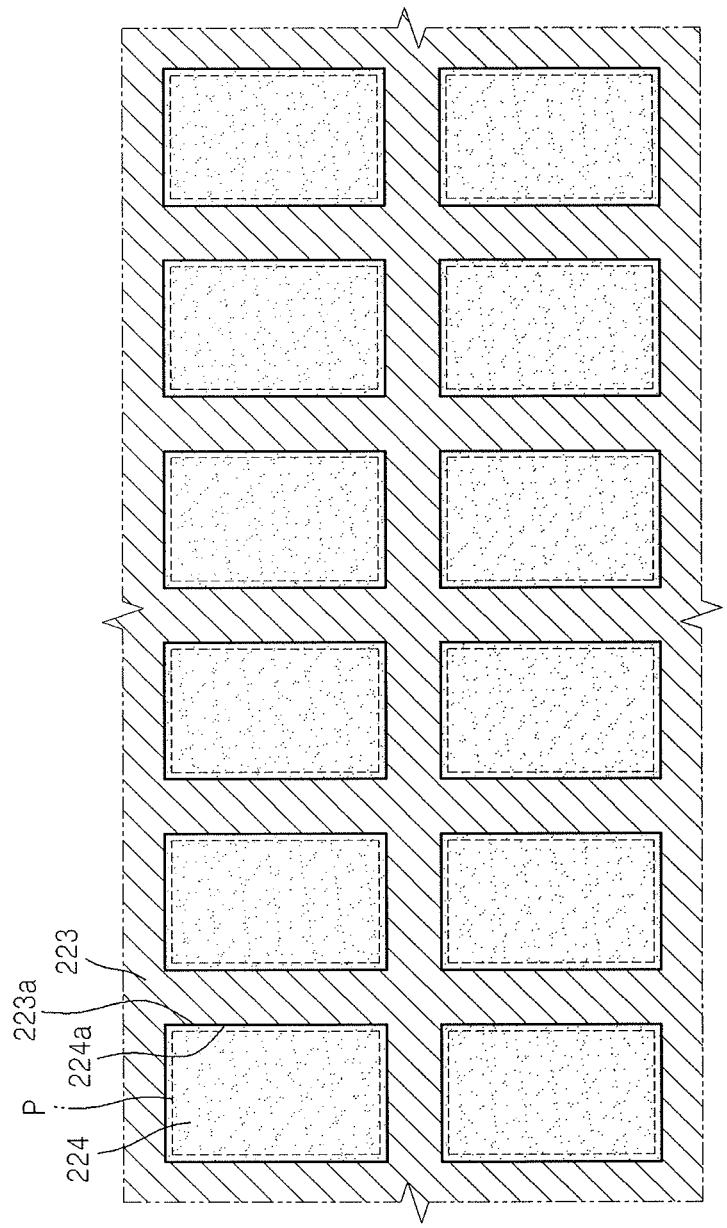
FIG. 8 is a plan view illustrating an organic emission unit according to an embodiment.

The first auxiliary layer 224 may be formed in an island shape in which one first auxiliary layer 224 is present in one pixel P as illustrated in FIG. 8. Although the first auxiliary layer 224 has an area covering the entire one pixel P in FIG. 8, embodiments are not limited thereto, and the first auxiliary layer 224 may cover a region where light emission occurs in one pixel P as described above.

In this case, the third electrode 223 forms a grid pattern between the pixels P.

Figure 9:
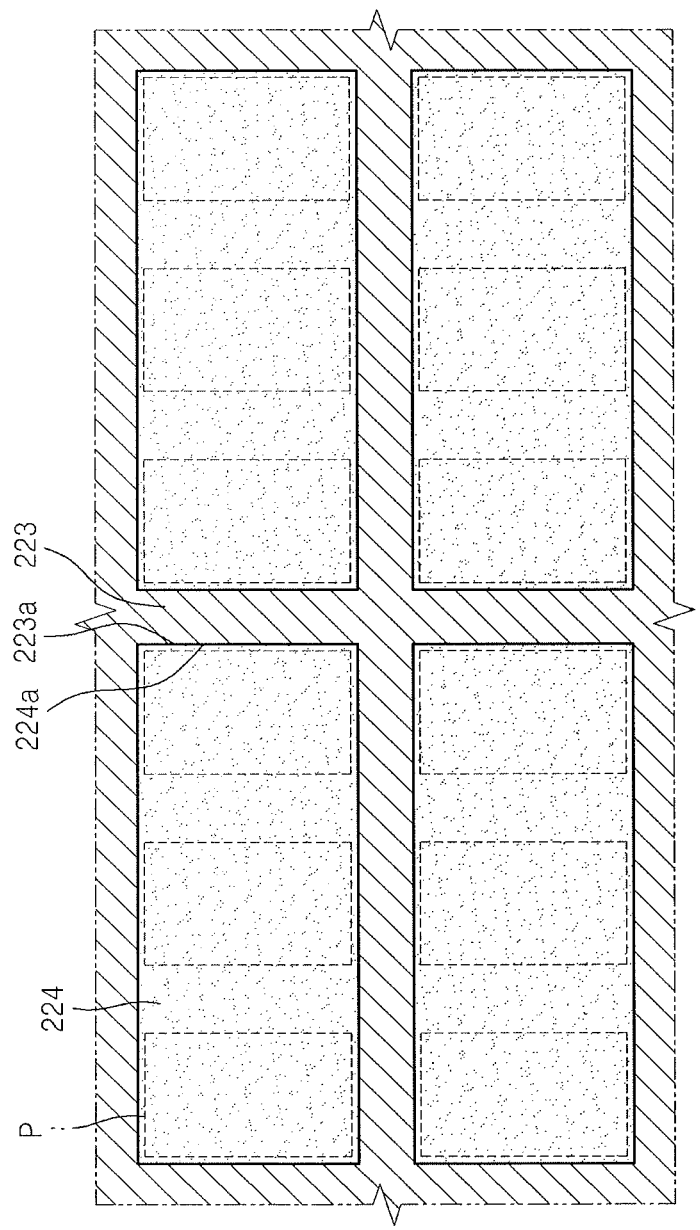
FIG. 9 is a plan view illustrating an organic emission unit according to another embodiment.

The first auxiliary layer 224 may be formed in an island shape in which one first auxiliary layer 224 is present in a plurality of pixels P as illustrated in FIG. 9. In this case, the third electrode 223 forms a grid pattern passing between the plurality of pixels P.

Figure 10:
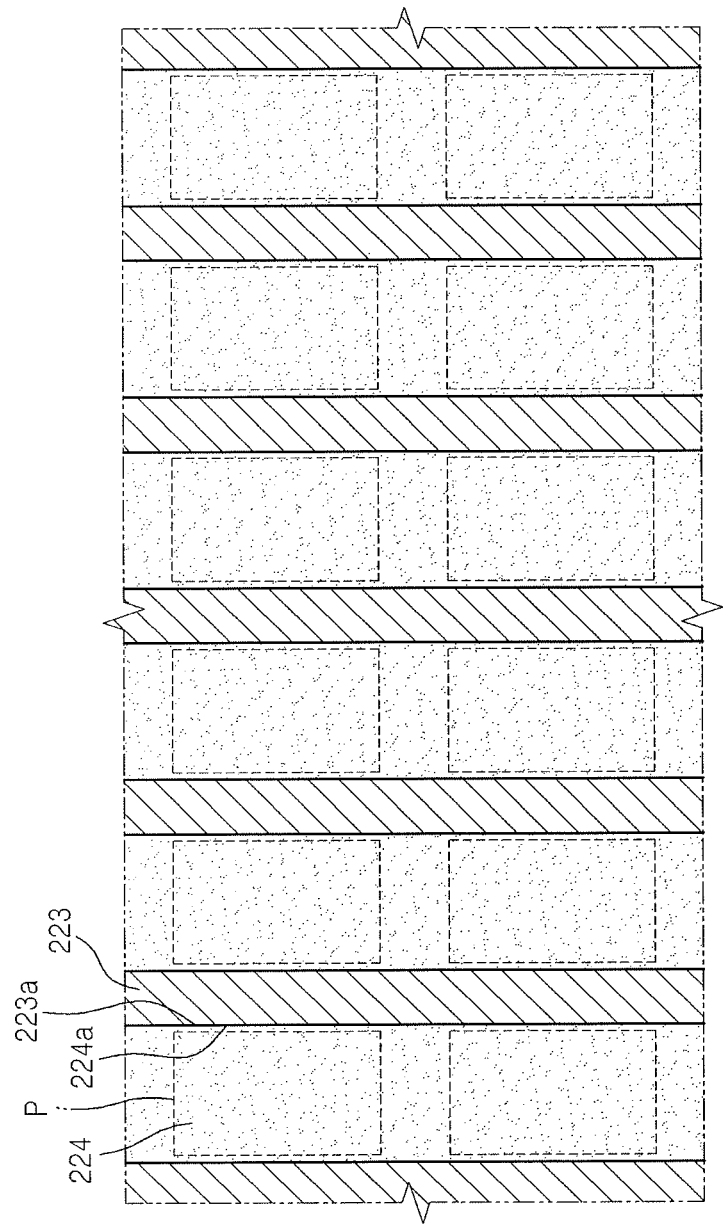
FIG. 10 is a plan view illustrating an organic emission unit according to another embodiment.

The first auxiliary layer 224 may be formed in a strip shape to cover the plurality of pixels P that are arranged in sequence as illustrated in FIG. 10. In this case, the third electrode 223 forms a stripe pattern passing between pixel columns.

As a modified example of FIG. 10, although not illustrated in the drawing, the first auxiliary layer 224 may be formed in a stripe shape to cover the plurality of pixels P in a horizontal direction. In this case, the third electrode 223 forms a stripe pattern passing between pixel rows.

Meanwhile, as illustrated in FIG. 7, when the material M3 for forming the third electrode 223 is deposited, the third electrode 223 may be formed only in a region other than the first auxiliary layer 224, and additionally, a thin film 223' having a second thickness t2 thinner than a first thickness t1 of the third electrode 223 formed in the region other than the first auxiliary layer 224 may be formed on the first auxiliary layer 224. This is because although in theory, the material M3 for forming the third electrode 223 is not formed on the first auxiliary layer 224 and formed only on the second electrode 222 having relatively good adhesion since the material M3 for forming the third electrode 223 has poor adhesion to the first auxiliary layer 224, the thin film 223' having the second thickness t2 may be formed on the first auxiliary layer 224 by being physically thinly put on the first auxiliary layer 224 since the material M3 is deposited using the open mask instead of using a separate patterning mask in the process illustrated in FIG. 7.

Since the second thickness t2 is smaller than the first thickness t1, the second thickness t2 may not greatly affect brightness of the OLED in the first region R1.

Figure 12:
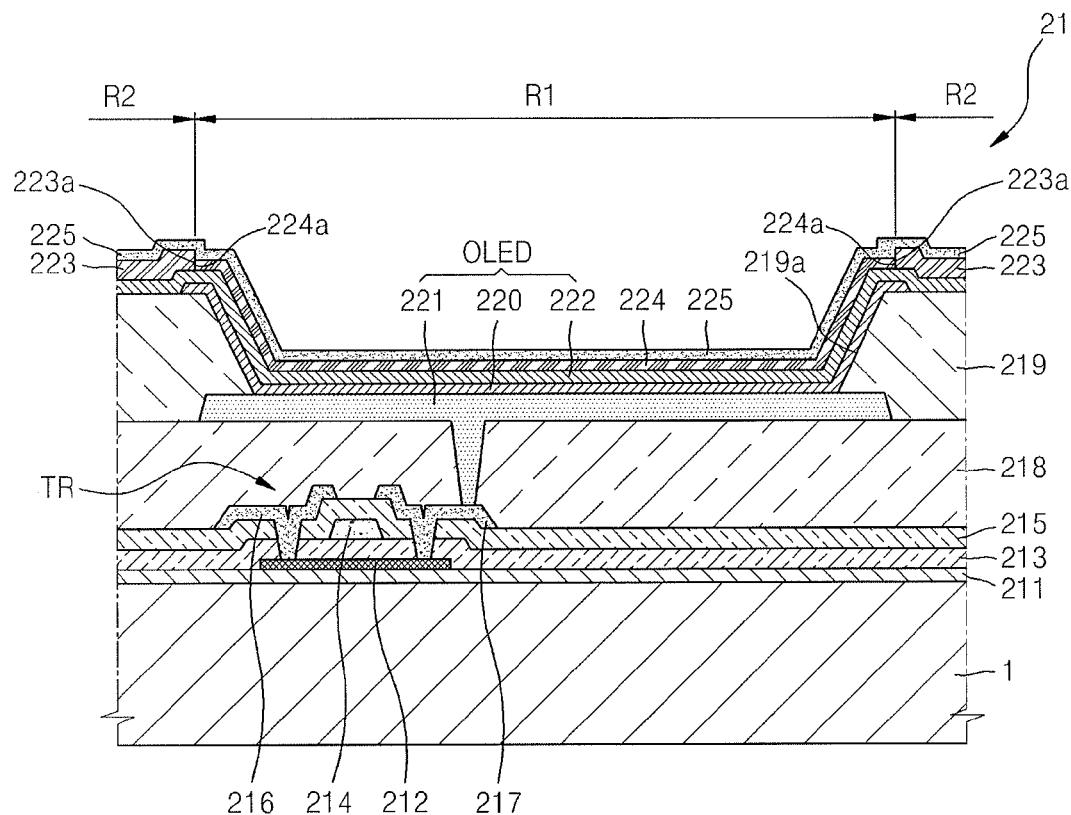
FIG. 12 is a cross-sectional view illustrating an organic emission unit according to another embodiment.

FIG. 12 is a cross-sectional view of the organic emission unit 21 of an organic light-emitting display device according to another embodiment.

Referring to FIG. 12, according to another embodiment, the second auxiliary layer 225 is formed on the first auxiliary layer 224. Other components have functions that are similar to or the same as the corresponding components of the above-described embodiment, and thus details thereof will not be repeated.

Figure 13:
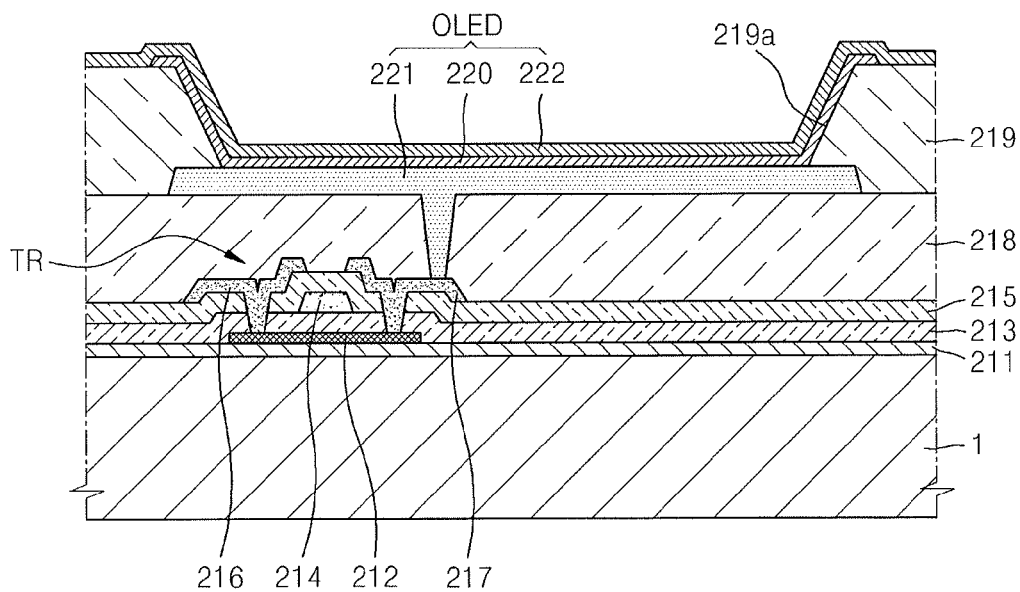
FIGS. 13 through 16 are cross-sectional views sequentially illustrating a method of manufacturing the organic emission unit illustrated in FIG. 12.
Figure 14:
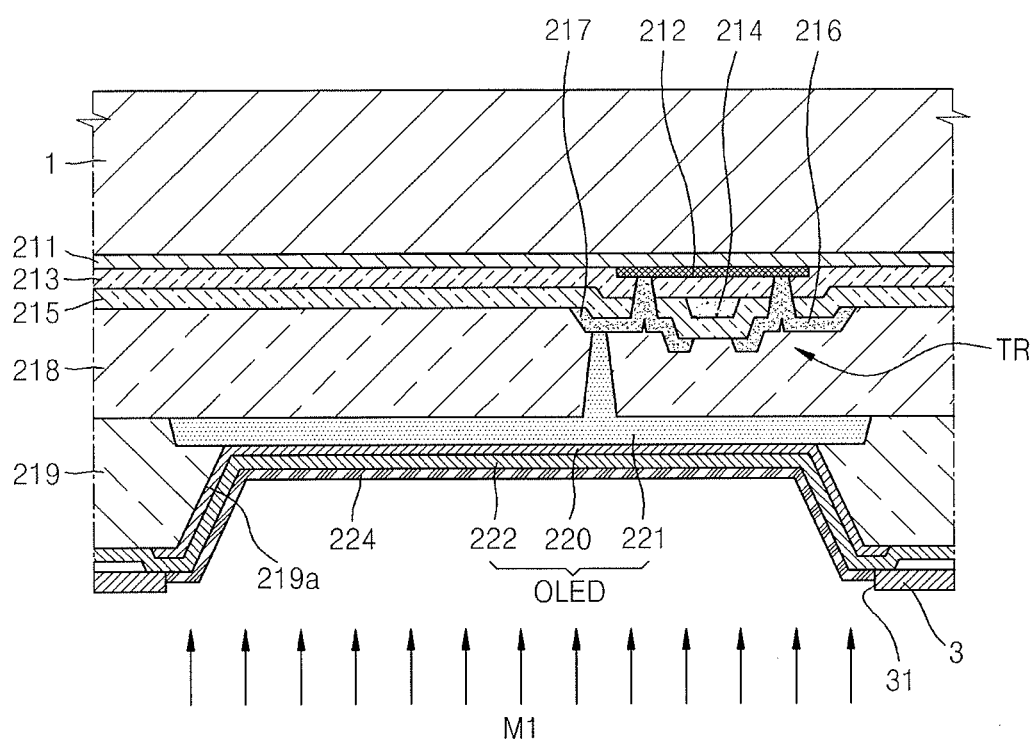

First, as illustrated in FIG. 13, after forming up to the second electrode 222, the first auxiliary layer 224 is formed using the mask 3 as illustrated in FIG. 14. Since the first auxiliary layer 224 may be formed of the aforementioned organic material, the first auxiliary layer 224 may be formed by thermal evaporation using the mask 3. Meanwhile, embodiments are not limited thereto, and the first auxiliary layer 224 may be formed by laser transfer using a donor film in addition to the thermal evaporation. The opening 31 is formed in the mask 3 to correspond to a pattern of the first auxiliary layer 224, and the material M1 for forming the first auxiliary layer 224 is deposited through the opening 31, thereby forming the first auxiliary layer 224.

Figure 15:
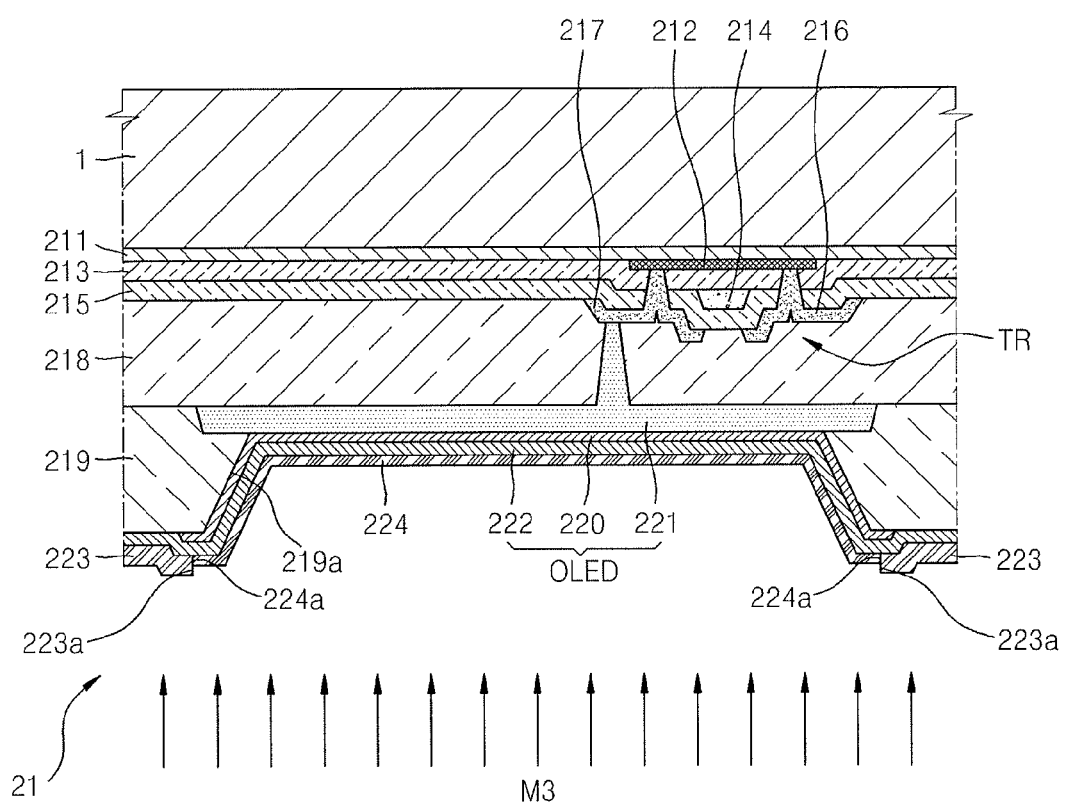

Next, as illustrated in FIG. 15, the material M3 for forming the third electrode 223 is entirely deposited on the organic emission unit 21. Although not illustrated in FIG. 15, the material M3 may be formed using an open mask that is opened with respect to all pixels or without using a mask.

In this case, since the material M3 for forming the third electrode 223 may have relatively poor adhesion to the first auxiliary layer 224, the material M3 may not be formed on the first auxiliary layer 224 and may be formed only on the second electrode 222 having relatively good adhesion. Accordingly, the third electrode 223 may be naturally patterned without using a separate mask or a patterning process.

Figure 16:
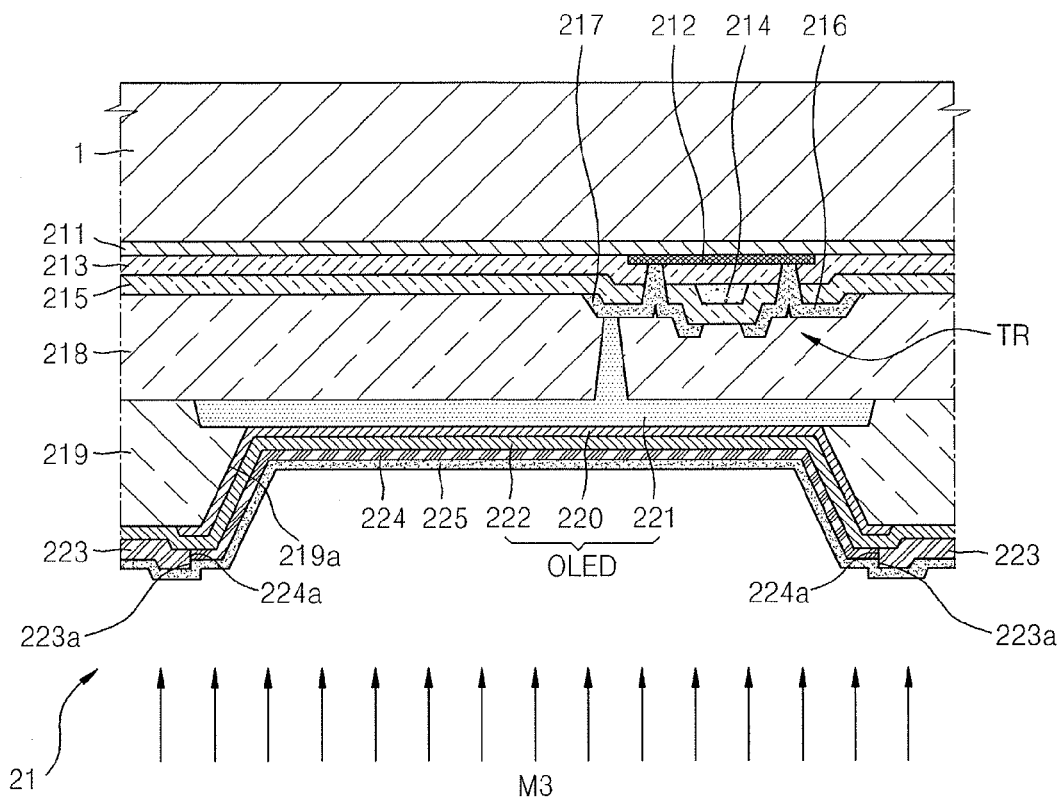

Next, as illustrated in FIG. 16, the material M2 for forming the second auxiliary layer 225 is entirely formed on the organic emission unit 21. Although not illustrated in FIG. 16, the material M2 may be formed using an open mask that is opened with respect to all pixels or without using a mask. The material M2 for forming the second auxiliary layer 225 may be formed not only on the first auxiliary layer 224, which is formed of an organic material, but also on the third electrode 223.

Even though the material M2 for forming the second auxiliary layer 225 may have relatively poor adhesion to the third electrode 223, the material M2 is deposited using the open mask instead of using a separate patterning mask in the process illustrated in FIG. 16, and thus the material M2 having a thickness smaller than a thickness of the second auxiliary layer 224 formed on the first auxiliary layer 224 may be formed on the second electrode 223 by being physically put on the second electrode 223.

Meanwhile, as illustrated in FIG. 15, when the material M3 for forming the third electrode 223 is deposited, the third electrode 223 may be formed only in a region other than the first auxiliary layer 224, and additionally, the thin film 223' having the second thickness t2 smaller than the first thickness t1 of the third electrode 223 formed in the region other than the first auxiliary layer 224 may be formed on the first auxiliary layer 224. In this case, since the second auxiliary layer 225 is formed using the process illustrated in FIG. 16, the second auxiliary layer 225 may be formed on both the third electrode 223 having the first thickness t1 and the thin film 223' having the second thickness t2.

Although not illustrated in the drawing, as another embodiment, the embodiment illustrated in FIG. 12 and the embodiment illustrated in FIG. 3 may be combined to employ a structure in which the second auxiliary layer 225 is formed in the first region R1 on the second electrode 222 as illustrated in FIG. 3, the first auxiliary layer 224 is stacked on the second auxiliary layer 225, and the third electrode 223 is patterned using the first auxiliary layer 224, and then the second auxiliary layer 225 is entirely formed again as illustrated in FIG. 12

Figure 18:
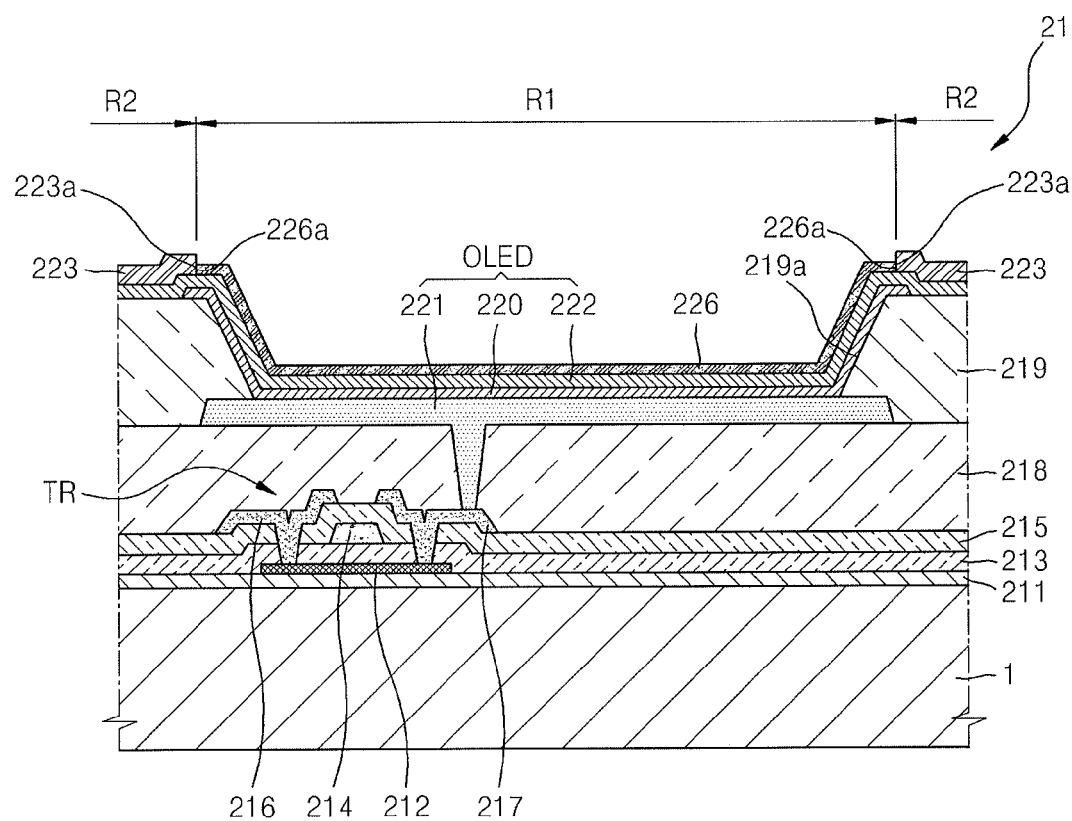
FIG. 18 is a cross-sectional view illustrating an organic emission unit according to another embodiment.

FIG. 18 is a cross-sectional view of the organic emission unit 21 of an organic light-emitting display device according to another embodiment.

Referring to FIG. 18, according to another embodiment, a mixed layer 226 is formed in the first region R1 on the second electrode 222, wherein the mixed layer 226 is formed by co-evaporation of the material M2 for forming the second auxiliary layer 225 and the material M1 for forming the first auxiliary layer 224.

First, in the same manner as in FIG. 13, after forming up to the second electrode 222, the mixed layer 226 is formed using the mask 3 in a similar manner to FIG. 14. The opening 31 is formed in the mask 3 to correspond to a pattern of the mixed layer 226, and the mixed layer 226 is formed by co-evaporation of the material M1 for forming the first auxiliary layer 224 and the material M2 for forming the second auxiliary layer 225 via the opening 31.

The mixed layer 226 includes the material M1 for forming the first auxiliary layer 224 and the material M3 for forming the electrode 223, which may have relatively poor adhesion to the first auxiliary layer 224, and thus similarly to FIG. 15, the material M3 for forming the electrode 223 may not be formed on the mixed layer 226 and may be formed only on the second electrode 222 having relatively good adhesion. Accordingly, as illustrated in FIG. 18, the third electrode 223 may be naturally patterned without using a separate mask or a patterning process. A lateral surface of the third edge 223a of the third electrode 223 is formed to contact a lateral surface of a fourth edge 226a of the mixed layer 226. According to FIG. 18, since a co-evaporation is used, two separate layers are not present, and the mixed layer 226 of the first auxiliary layer and the second auxiliary layer is present.

Figure 19:
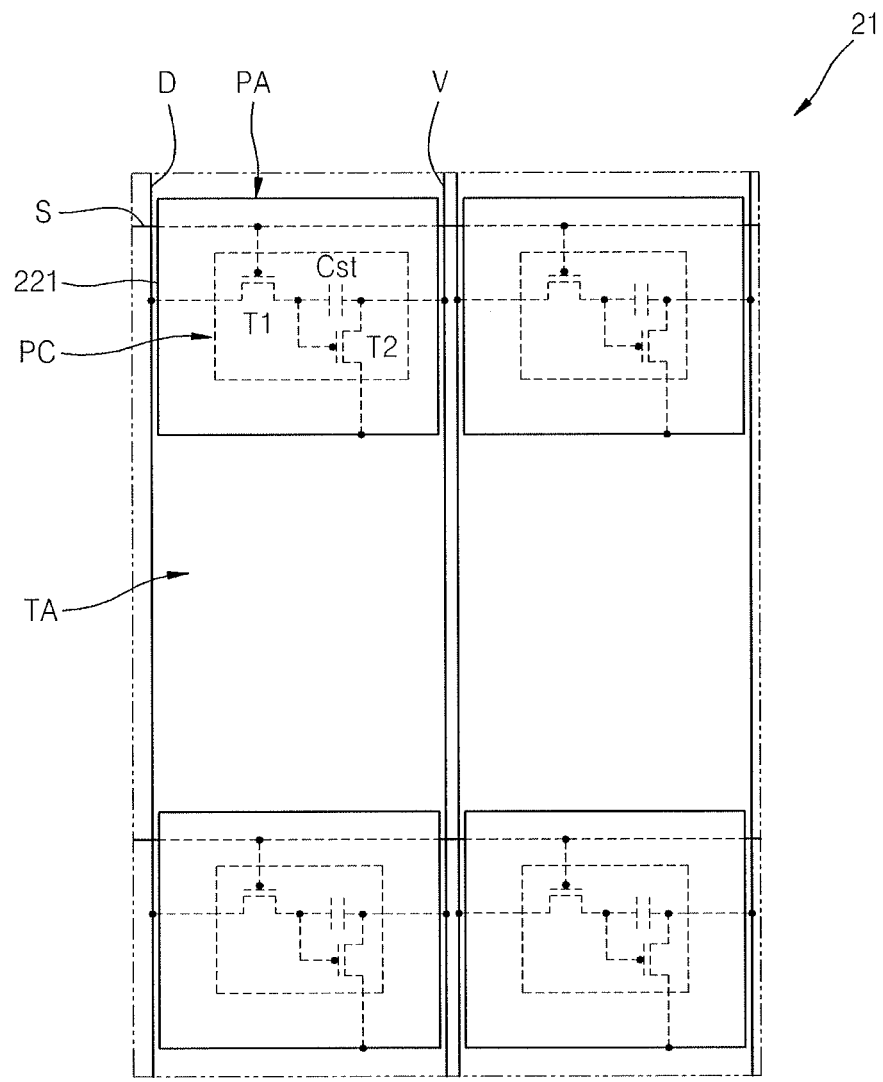
FIG. 19 is a plan view illustrating an organic emission unit according to another embodiment.
Figure 20:
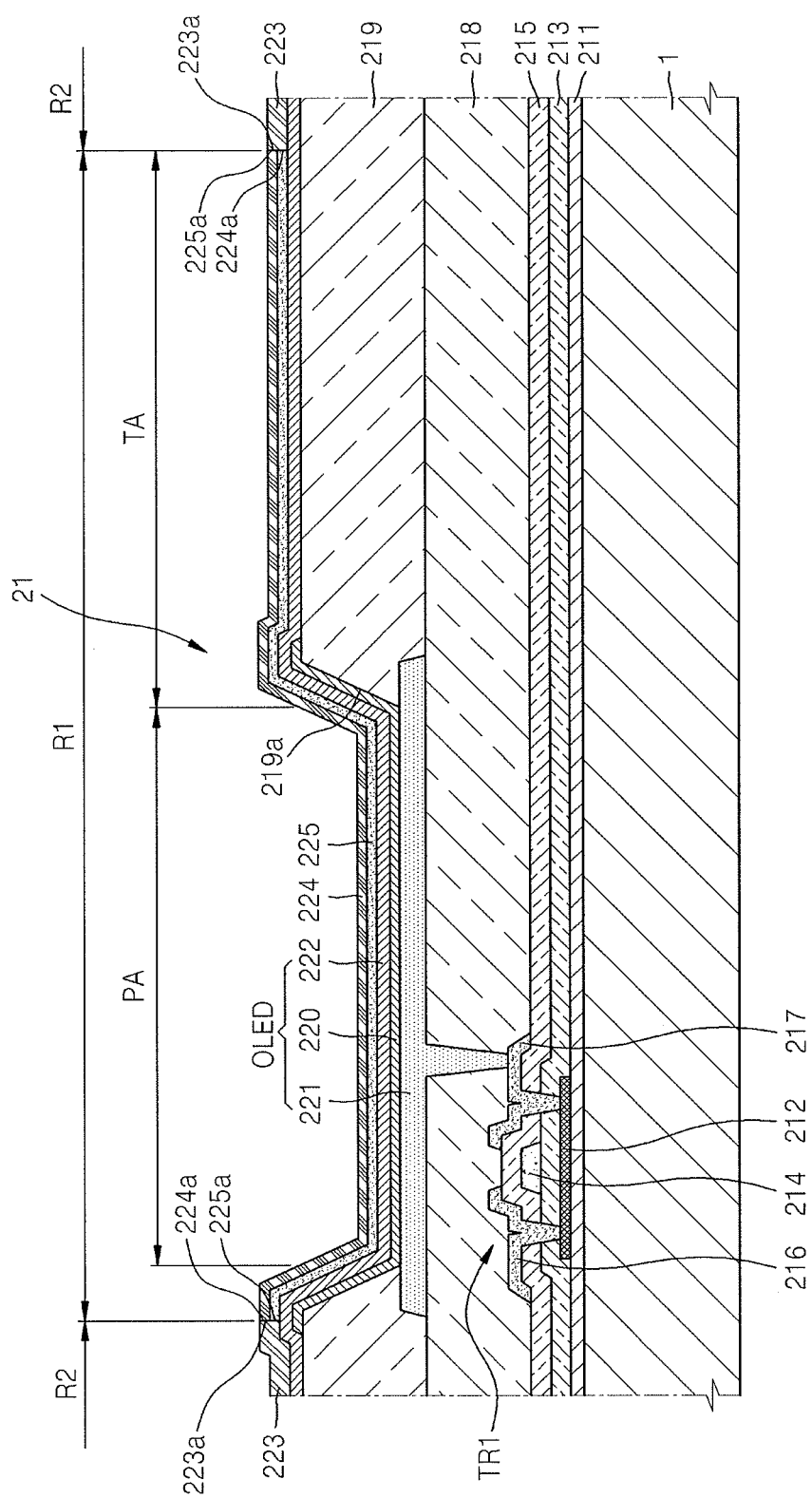
FIG. 20 is a cross-sectional view illustrating one pixel of FIG. 19.

FIG. 19 is a plan view illustrating the organic emission unit 21 of an organic light-emitting display device according to another embodiment. FIG. 20 is a cross-sectional view illustrating one pixel of FIG. 19.

Referring to FIGS. 19 and 20, according to another example embodiment, the organic emission unit 21 is partitioned into a transmission area TA through which external light passes and a plurality of pixel areas PA that are spaced apart from each other by interposing the transmission area TA therebetween.

As illustrated in FIG. 19, a pixel circuit unit PC is located in each pixel area PA, and a plurality of conductive lines, such as a scan line S, a data line D, and a Vdd line V, are electrically connected to the pixel circuit unit PC. Although not illustrated in FIG. 19, various other conductive lines may be included according to the configuration of the pixel circuit unit PC in addition to the scan line S, the data line D, and the Vdd line V, which is a driving power supply.

As illustrated in FIG. 19, the pixel circuit unit PC includes a first thin film transistor T1 that is connected to the scan line S and the data line D, a second thin film transistor T2 that is connected to the first thin film transistor T1 and the Vdd line V, and a capacitor Cst that is connected to the first thin film transistor T1 and the second thin film transistor T2. At this time, the first thin film transistor T1 is a switching transistor, and the second thin film transistor T2 is a driving transistor. The second thin film transistor T2 is electrically connected to the first electrode 221. Although the first thin film transistor T1 and the second thin film transistor T2 may be formed as p-type thin film transistors in FIG. 19, embodiments are not limited thereto, and at least one of the first thin film transistor T1 and the second thin film transistor T2 may be formed as an n-type thin film transistor. A number of thin film transistors and a number of capacitors are not limited to those illustrated in the embodiment of FIG. 19, and two or more thin film transistors and one or more capacitors may be combined according to the configuration of the pixel circuit unit PC.

Referring to FIG. 19, the scan line S is disposed to overlap with the first electrode 221. However, embodiments are not limited thereto, and at least one of the plurality of conductive lines including the line S, the data line D, and the Vdd line V may be disposed to overlap with the first electrode 221, and under different conditions, all the conductive lines including the line S, the data line D, and the Vdd line V may be disposed to overlap with the first electrode 221 or may be disposed at the side of the first electrode 221.

In the current embodiment, since the pixel area PA and the transmission area TA are separated from each other, when observing the outside through the transmission area TA, external image distortion occurring due to external light scattering in association with patterns of elements inside the pixel circuit unit PC may be avoided.

The pixel area PA and the transmission area TA are formed so that a ratio of an area of the transmission area TA with respect to the total area of the pixel area PA and the transmission area TA is within a range of about 5% to about 90%.

If the ratio of the transmission area TA with respect to the total area of the pixel area PA and the transmission area TA is less than about 5%, an amount of light that may pass through the organic emission unit 21 may be small, and thus it may be difficult for a user to see an object or an image located on the opposite side of the user. In other words, it may be difficult to express the organic emission unit 21 as transparent. Even though it is assumed that the ratio of the transmission area TA with respect to the total area of the pixel area PA and the transmission area TA is about 5%, if the intensity of external light is actually strong, the user may sufficiently recognize the object and the image that passes through a display device and is located on the opposite side of the user, and thus the user may recognize the display device as a transparent display device. In addition, as will be described below, when the film transistor included in the pixel circuit unit PC is formed as a transparent thin film transistor like an oxide semiconductor and the OLED is formed as a transparent element, recognition as a transparent display device may further grow.

If the ratio of the transmission area TA with respect to the total area of the pixel area PA and the transmission area TA is greater than about 90%, pixel integration of the organic emission unit 21 may be decreased, and thus it may be difficult to display a stable image through light emission in the pixel area PA. In other words, as the area of the pixel area PA becomes smaller, brightness of light emitted from the organic layer 220 needs to be increased in order to display an image. As such, if the OLED is operated in a high brightness state, the lifespan of the OLED may be rapidly reduced.

The ratio of the transmission area TA with respect to the total area of the pixel area PA and the transmission area TA may be within a rage of about 20% to about 70%, If the ratio is less than about 20%, the area of the pixel area PA may be large as compared to that of the transmission area TA, and thus a user has a limitation in observing an external image through the transmission area TA. If the ratio is greater than about 70%, there may be limitations in designing the pixel circuit unit PC to be disposed in the pixel area PA.

The first electrode 221 electrically connected to the pixel circuit unit PC is included in the pixel area PA, and the pixel circuit unit PC overlaps with the first electrode 221 to be covered by the pixel electrode 221. In addition, at least one of the above-described conductive lines including the scan line S, the data line D, and the Vdd line V may be disposed to pass through the pixel electrode 221. Since these conductive lines are less likely to hinder transmission as compared to the pixel circuit unit PC, all the conductive lines may be disposed adjacent to the first electrode 221 according to design conditions.

As described above, if the first electrode 221 includes a reflective layer formed of a conductive metal capable of reflecting light, the first electrode 221 covers the pixel circuit unit PC, and external light distortion, or the like due to the pixel circuit unit PC in the pixel area PA is prevented.

As illustrated in FIG. 20, the pixel area PA and the transmission area TA are located in the first region R1.

At this time, since the second auxiliary layer 225 and the first auxiliary layer 224 are located in the first region R1, the second auxiliary layer 225 and the first auxiliary layer 224 cover both the pixel area PA and the transmission area TA. The third electrode 223 is included in the second region R2 outside of the first region R1.

In the current embodiment, since the second auxiliary layer 225 and the first auxiliary layer 224 are formed of a transparent organic material as described above, the second auxiliary layer 225 and the first auxiliary layer 224 may not affect light transmission in the transmission area TA. Materials and manufacturing methods of the second auxiliary layer 225, the first auxiliary layer 224, and the third electrode 223 are the same as those described in the above-described embodiments.

Although not illustrated in FIG. 20, a transmissive window, from which at least a part of the second electrode 222 is removed, may be formed in the transmission area TA so as to further increase light transmission in the transmission area TA. At this time, the transmissive window is not limited to removal of the second electrode 222, and the transmissive window may further be formed in at least one of the second insulating layer 219, the first insulating layer 218, the insulating interlayer 215, the gate insulation layer 213, and the buffer layer 211.

Although the second auxiliary layer 225 and the first auxiliary layer 224 are sequentially formed on the second electrode 222 in this order in FIG. 20, embodiments are not limited thereto. Thus, the second auxiliary layer 225 may be formed on the first auxiliary layer 224 so as to cover the first auxiliary layer 224 and the third electrode 223 as illustrated in FIG. 12, and the material M2 for forming the second auxiliary layer 225 may be formed by co-evaporation to form the mixed layer 226 when forming the first auxiliary layer 224 as illustrated in FIG. 18.

Figure 21:
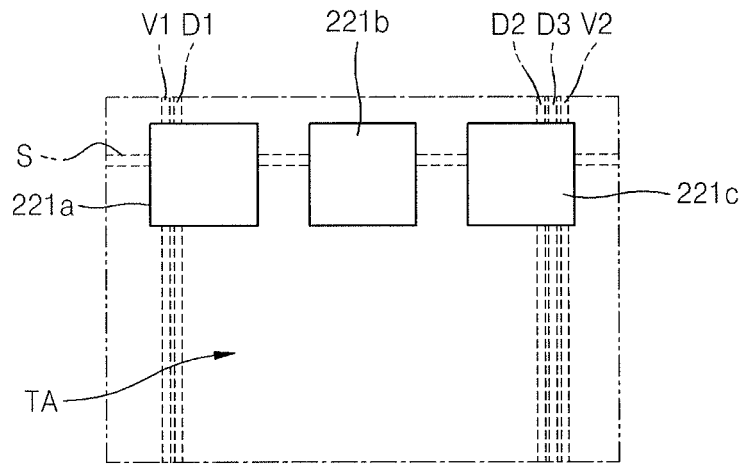
FIG. 21 is a plan view illustrating an organic emission unit according to another embodiment.

FIG. 21 shows another example of the transparent organic emission unit described with reference to FIGS. 19 and 20.

The embodiment illustrated in FIG. 21 shows a case where one pixel is realized by three sub-pixels, i.e., red, green, and blue sub-pixels to emit white light. The embodiment illustrated in FIG. 21 may also include a case where white light is emitted using other colors of light in addition to red, green, and blue.

In this case, one transmission area TA is formed in each of first electrodes 221a, 221b, and 221c of the three sub-pixels. A first data line D1 through a third data line D3 are electrically connected to the first electrodes 221a, 221b, and 221c of the three sub-pixels, respectively. A first Vdd line V1 is electrically connected to the first first electrode 221a and the second first electrode 221b, and the second Vdd line V2 is electrically connected to the third first electrode 221c.

In such a structure, since one large transmission area TA is included with respect to a plurality of sub-pixels, transmittance of the entire display may further be increased, and image distortion due to light scattering may further be reduced.

Although not illustrated in FIG. 21, one large transmissive window from which at least a part of the second electrode 222 is removed may also be formed in the transmission area TA. At this time, the transmissive window is not limited to the removal of the second electrode 222, and the transmissive window may further be formed in at least one of a second insulating layer, a first insulating layer, an insulating interlayer, a gate insulation layer, and a buffer layer.

Figure 11:
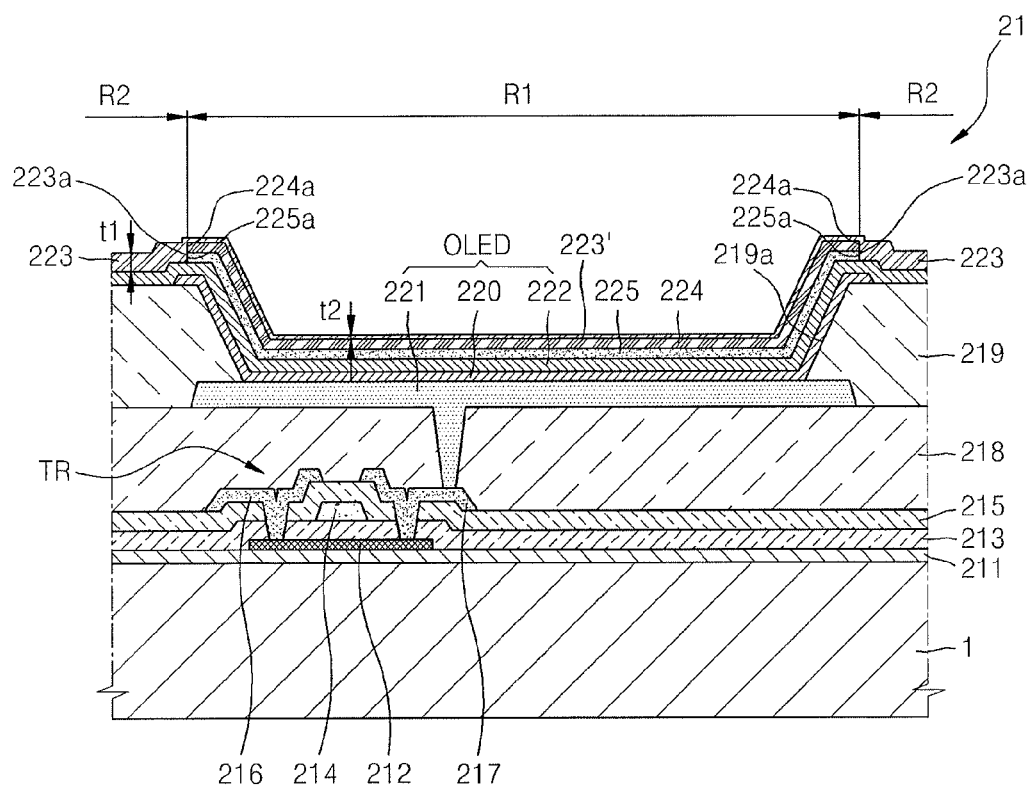
FIG. 11 is a cross-sectional view illustrating an organic emission unit according to another embodiment of FIG. 3.
Figure 17:
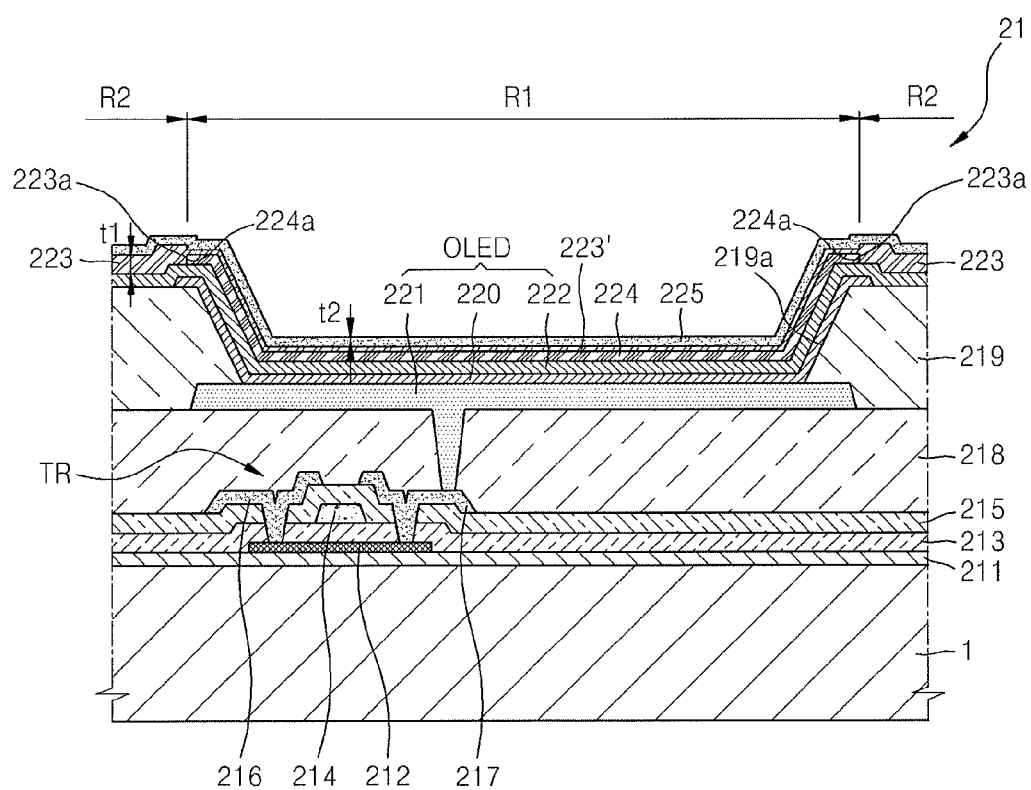
FIG. 17 is a cross-sectional view illustrating an organic emission unit according to another embodiment of FIG. 12.

In the embodiment illustrated in FIGS. 19 through 21, a thin film that is formed of the material M3 for forming the third electrode 223 and is formed relatively thin may further be formed on the second auxiliary layer 225 and the first auxiliary layer 224 of the first region R1 as illustrated in FIGS. 11 and 17. In this case, as described above, since the thin film has an extremely small thickness, the thin film may not greatly affect light transmission, or the like in the transmission area TA.

Figure 22:
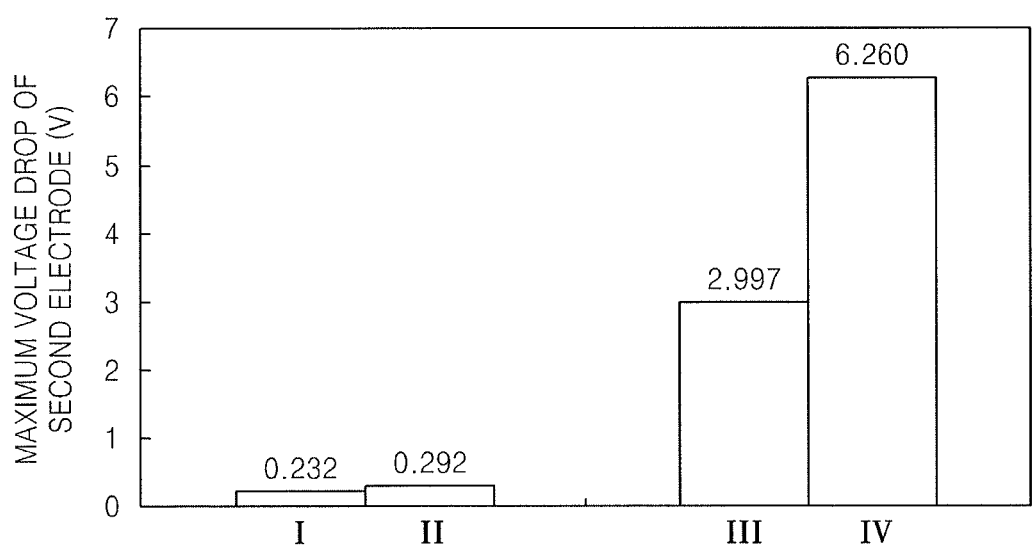
FIG. 22 is a graph illustrating an amount of maximum voltage drop of a second electrode in a case where a third electrode is formed according to an embodiment.

FIG. 22 is a graph illustrating an amount of maximum voltage drop of the second electrode 222 in a case where the third electrode 223 is formed according to an embodiment. In each example, the second electrode 222 is formed of Mg:Ag/Ag, and surface resistance of the second electrode 222 is 20 ohm/sq.

In an experiment example 1, the first auxiliary layer 224 and the third electrode 223 are formed in a 19 inch display device to have a structure illustrated in FIGS. 3 and 7. Here, the third electrode 223 is deposited with Mg at 3,500 Å.

In an experiment example 2, the first auxiliary layer 224 and the third electrode 223 are formed in a 40 inch display device to have a structure illustrated in FIGS. 3 and 7. Here, the third electrode 223 is deposited with Mg at 3,500 Å.

In a comparative example 3, the first auxiliary layer 224 and the third electrode 223 are not formed in a 19 inch display device.

In a comparative example 4, the first auxiliary layer 224 and the third electrode 223 are not formed in a 40 inch display device.

As illustrated in FIG. 22, an amount of voltage drop of the second electrode 222 in the experiment examples 1 and 2 is significantly lower than that of the second electrode 222 in the comparative examples 3 and 4.

Table 1 below shows an effect of improving optical properties in a case where the organic emission unit 21 further includes the second auxiliary layer 225 in addition to the first auxiliary layer 224.

In Table 1 below, CE/y denotes a value obtained by dividing optical efficiency cd/A by a color coordinate CIE y in a blue OLED and represents pure light extraction efficiency irrelevant to a psycho-visual characteristic. In addition, in Table 1 below, an efficiency ratio based on the comparative example 1 has a unit of %, and as a value of the efficiency ratio is close to 100, there is no optical loss due to the first auxiliary layer 224 and/or the second auxiliary layer 225.

TABLE 1

|  |  | Thickness (Å) | CE/y | Efficiency ratio (%) |
|---|---|---|---|---|
| Comparative example 1 | second auxiliary layer | 660 | 95.3 | 100 |
| Comparative example 2 | first auxiliary layer | 820 | 85.2 | 89 |
| Experiment example 1 | second auxiliary layer/first auxiliary layer | 600/100 | 95.5 | 100 |
| Experiment example 2 | first auxiliary layer/second auxiliary layer | 100/580 | 95.3 | 100 |

The comparative example 1 shows a case where only the auxiliary layer having a thickness of 660 Å is formed in the first region on the second electrode, and the comparative example 2 shows a case where only the first auxiliary layer having a thickness of 820 Å is formed in the first region on the second electrode.

The experiment example 1 shows a case where the second auxiliary layer having a thickness of 600 Å and the first auxiliary layer having a thickness of 100 Å are sequentially formed in the first region on the second electrode as illustrated in FIG. 3 according to an embodiment, and the experiment example 2 shows a case where the first auxiliary layer having a thickness of 100 Å and the second auxiliary layer having a thickness of 580 Å are sequentially formed in the first region on the second electrode as illustrated in FIG. 12 according to another embodiment.

As illustrated in Table 1, in the experiment example 1 and the experiment example 2, the value of CE/y is large and the efficiency ratio is not reduced, unlike the comparative example 2. Accordingly, it can be seen that the light extraction efficiency is improved and optical properties are improved by the second auxiliary layer.

Although a top emission type organic light-emitting display device has been mainly described above, embodiments are not limited thereto. Embodiments may also be applied to a bottom emission type organic light-emitting display device in which an image is displayed toward the substrate 1 or a dual emission type organic light-emitting display device in which an image is displayed in both directions.

By way of summation and review, a large-sized display device using an organic light-emitting display device has been considered. In such a device, wiring resistance of a common electrode that covers all pixels may be increased. In addition, in the organic light-emitting display device, the common electrode may be damaged due to an encapsulation member above the common electrode during use or manufacturing and thus, a first auxiliary layer for protecting the common electrode against the encapsulation member may be used. However, when a material to form the first auxiliary layer has a low refractive index, optical properties of the organic light-emitting display device may be degraded.

As described above, embodiments relate to an organic light-emitting display device that may be formed as a large-sized panel and may improve optical properties, and a method of manufacturing the organic light-emitting display device. Embodiments may provide an organic light-emitting display device that decreases wiring resistance of a common electrode, protects the common electrode, and prevents degradation of optical properties, and a method of manufacturing the organic light-emitting display device. According to embodiments, a third electrode may be naturally patterned by a first auxiliary layer without performing a separate patterning process. Accordingly, risks such as damage of the second electrode due to patterning of the third electrode may be reduced prevented. According to embodiments, voltage drop of the second electrode may be prevented by forming the third electrode. According to embodiments, the second electrode may be protected by the first auxiliary layer. According to embodiments, a decrease in optical properties due to the first auxiliary layer may be prevented by forming the second auxiliary layer.

While the present invention has been particularly illustrated and described with reference to example embodiments thereof, it will be understood by those of skill in the art that various changes in form and details may be made therein without departing from the spirit and scope of the present invention as defined by the following claims.

What is claimed is:

1. An organic light-emitting display device, comprising:
    a substrate;
    a thin film transistor formed on the substrate;
    a first insulating layer that covers the thin film transistor;
    a first electrode that is formed on the first insulating layer and is electrically connected to the thin film transistor;
    a second insulating layer that is formed on the first insulating layer to cover the first electrode and has an opening exposing a part of the first electrode;
    an organic emission layer that is formed on a part of the second insulating layer and on the first electrode;
    a second electrode that is formed on the second insulating layer and the organic emission layer;
    a first auxiliary layer that is formed in a first region on the second electrode and has a first edge;
    a third electrode that is formed in a second region, which is a region other than the first region, on the second electrode; and a second auxiliary layer that is formed on at least the first region and has a refractive index higher than that of the first auxiliary layer, the second auxiliary layer directly contacts the third electrode, and the first and second auxiliary layers have a substantially uniform thickness in the first region, in which the second auxiliary layer is thicker than the first auxiliary layer, the second auxiliary layer contacts the first auxiliary layer, and the second auxiliary layer and the first auxiliary layer are formed with different organic materials.

2. The device as claimed in claim 1, wherein the second auxiliary layer is disposed in the first region on the second electrode, wherein the first auxiliary layer covers the second auxiliary layer.

3. The device as claimed in claim 1, wherein the second auxiliary layer is disposed in the first region on the first auxiliary layer.

4. The device as claimed in claim 3, wherein the second auxiliary layer is disposed up to the second region on the third electrode.

5. The device as claimed in claim 1, wherein the second auxiliary layer includes at least one material having a high refractive index among N4,N4'-diphenyl-N4,N4'-bis(9-phenyl-9H-carbazol-3-yl)diphenyl-4,4'-diamine and N(diphenyl-4-yl)9,9-dimethyl-N-(4(9-phenyl-9H-carbazol-3-yl)phenyl)-9H-fluorene-2-amine.

6. The device as claimed in claim 5, wherein the first auxiliary layer includes at least one material among 8-quinolinato lithium and 2-(4-(9,10-di(naphthalene-2-yl)anthracene-2-yl)phenyl)-1-phenyl-1H-benzo-[D]imidazole.

7. The device as claimed in claim 6, wherein both the first auxiliary layer and the second auxiliary layer are disposed in the first region on the second electrode, and the material of the first auxiliary layer and the material having a high refractive index are mixed with each other to form one layer.

8. The device as claimed in claim 1, wherein the second auxiliary layer is formed such that light transmission is possible.

9. The device as claimed in claim 1, wherein the third electrode has a second edge, of which a lateral surface contacts a lateral surface of the first edge of the first auxiliary layer.

10. The device as claimed in claim 1, wherein the second auxiliary layer has a refractive index of about 1.8 to about 2.0 with respect to a wavelength of green light.

11. The device as claimed in claim 1, wherein the second auxiliary layer has a refractive index of about 1.9 to about 2.5 with respect to a wavelength of blue light.

12. The device as claimed in claim 1, wherein the second electrode is formed such that light transmission is possible.

13. The device as claimed in claim 1, wherein the second electrode includes silver.

14. The device as claimed in claim 1, wherein the second electrode includes indium tin oxide, indium zinc oxide, zinc oxide, or $In_2O_3$.

15. The device as claimed in claim 1, wherein the third electrode has a thickness greater than that of the second electrode.

16. The device as claimed in claim 1, further comprising a transmission area and a pixel area that is adjacent to the transmission area and in which light emission occurs, wherein the transmission area and the pixel area are located in the first region, the first electrode overlaps with the pixel area, and the first electrode is located to cover the thin film transistor.

17. The device as claimed in claim 1, wherein the first auxiliary layer is formed such that light transmission is possible.

18. The device as claimed in claim 1, wherein adhesion between the third electrode and the first auxiliary layer is lower than adhesion between the third electrode and the second electrode.

19. The device as claimed in claim 8, wherein the second electrode and the third electrode include a same material.

20. An organic light-emitting display device, comprising:
a plurality of pixels, each pixel including a thin film transistor, a first electrode electrically connected to the thin film transistor, a second electrode that covers the pixel, and an organic emission layer that is interposed between the first electrode and the second electrode, the plurality of pixels including:
a first auxiliary layer that is formed in a first region on the second electrode;
a third electrode that is located between adjacent pixels, the third electrode being adjacent the first auxiliary layer and being electrically connected to the second electrode; and
a second auxiliary layer that is stacked on at least the first auxiliary layer in the first region and has a refractive index higher than that of the first auxiliary layer, the second auxiliary layer directly contacts the third electrode, and the first and second auxiliary layers have a substantially uniform thickness in the first region, in which the second auxiliary layer is thicker than the first auxiliary layer, the second auxiliary layer contacts the first auxiliary layer, and the second auxiliary layer and the first auxiliary layer are formed with different organic materials.

21. The device as claimed in claim 20, wherein the second auxiliary layer is disposed between the second electrode and the first auxiliary layer.

22. The device as claimed in claim 20, wherein the second auxiliary layer is disposed on the first auxiliary layer to cover the first auxiliary layer.

23. The device as claimed in claim 22, wherein the second auxiliary layer is disposed on the auxiliary layer to cover up to the third electrode.

24. The device as claimed in claim 20, wherein the second auxiliary layer includes at least one material having a high refractive index among N4,N4'-diphenyl-N4,N4'-bis(9-phenyl-9H-carbazol-3-yl)diphenyl-4,4'-diamine and N(diphenyl-4-yl)9,9-dimethyl-N-(4(9-phenyl-9H-carbazol-3-yl)phenyl)-9H-fluorene-2-amine.

25. The device as claimed in claim 24, wherein the first auxiliary layer includes at least one material among 8-quinolinato lithium and 2-(4-(9,10-di(naphthalene-2-yl)anthracene-2-yl)phenyl)-1-phenyl-1H-benzo-[D]imidazole.

26. The device as claimed in claim 25, wherein both the first auxiliary layer and the second auxiliary layer are disposed on the second electrode, and the material of the first auxiliary layer and the material having a high refractive index are mixed with each other to form one layer.

27. The device as claimed in claim 20, wherein the second auxiliary layer is formed such that light transmission is possible.

28. The device as claimed in claim 20, wherein the second auxiliary layer has a refractive index of about 1.8 to about 2.0 with respect to a wavelength of green light.

29. The device as claimed in claim 20, wherein the second auxiliary layer has a refractive index of about 1.9 to about 2.5 with respect to a wavelength of blue light.

30. The device as claimed in claim 20, wherein adhesion between the third electrode and the first auxiliary layer is lower than adhesion between the third electrode and the second electrode.

31. A method of manufacturing an organic light-emitting display device, the method comprising:
   forming a plurality of thin film transistors that are respectively located in a plurality of pixels on a substrate;
   forming a plurality of organic light-emitting diodes that are electrically connected to each of the thin film transistors, are respectively located in the plurality of pixels, and includes a first electrode, an organic emission layer, and a second electrode;
   forming a plurality of first auxiliary layers that are located to correspond to at least one of the pixels;
   forming a third electrode, which is adjacent to each of the first auxiliary layers and is electrically connected to second electrode, by depositing a metal on the pixels; and
   forming a second auxiliary layer that is stacked on the first auxiliary layer and has a refractive index higher than that of the first auxiliary layer, the second auxiliary layer directly contacting the third electrode, the first and second auxiliary layers having a substantially uniform thickness in a first region, in which the second auxiliary layer is thicker than the first auxiliary layer, the second auxiliary layer contacts the first auxiliary layer, and the second auxiliary layer and the first auxiliary layer are formed with different organic materials.

32. The method as claimed in claim 31, wherein, in the forming of the second auxiliary layer, a material having a high refractive index is deposited on the second electrode using a mask that has an opening having a pattern corresponding to at least one of the pixels.

33. The method as claimed in claim 31, wherein, in the forming of the second auxiliary layer, the material having a high refractive index is deposited on the entire substrate to cover the first auxiliary layer and the third electrode.

34. The method as claimed in claim 31, wherein, in the forming of the first auxiliary layer and the second auxiliary layer, the material having a high refractive index and the material of the first auxiliary layer are formed on the second electrode by co-evaporation using a mask that has an opening having a pattern corresponding to at least one of the pixels.

35. The method as claimed in claim 31, wherein the forming of the first auxiliary layer is performed using a mask that has an opening having a pattern corresponding to the first auxiliary layer.

36. The method as claimed in claim 31, wherein the forming of the first auxiliary layer is performed by laser transfer using a donor film corresponding to the first auxiliary layer.

37. The method as claimed in claim 31, wherein the forming of the third electrode includes depositing the metal on the first auxiliary layer and in a region adjacent to the first auxiliary layer.

* * * * *